(12) United States Patent
Suzuki

(10) Patent No.: US 7,109,903 B2
(45) Date of Patent: Sep. 19, 2006

(54) DIGITAL-ANALOG CONVERTER CIRCUIT

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/999,190

(22) Filed: Nov. 30, 2004

(65) Prior Publication Data

US 2005/0280567 A1    Dec. 22, 2005

(30) Foreign Application Priority Data

Jun. 17, 2004    (JP)    ............... 2004-180159

(51) Int. Cl.
H03M 1/66    (2006.01)
(52) U.S. Cl. .................................... 341/144
(58) Field of Classification Search ............ 341/154, 341/145, 153, 144, 156, 136
See application file for complete search history.

(56) References Cited

U.S. PATENT DOCUMENTS

| | | | |
|---|---|---|---|
| 5,648,780 A | | 7/1997 | Neidorff et al. |
| 6,384,762 B1 * | | 5/2002 | Brunolli et al. ............. 341/144 |
| 6,567,026 B1 * | | 5/2003 | Gorman ...................... 341/154 |

FOREIGN PATENT DOCUMENTS

| | | |
|---|---|---|
| JP | 61292322 | 12/1986 |
| JP | 10-154937 | 6/1998 |

OTHER PUBLICATIONS

European Search Report dated Sep. 30, 2005, 3 pages.

* cited by examiner

Primary Examiner—Brian Young
(74) Attorney, Agent, or Firm—Arent Fox PLLC

(57) ABSTRACT

Provided is a digital-analog converter circuit that enables, for example, securing an improved accurate analog signal voltage and preventing increase in the circuit size. A first node of each individual unit is connected to a middle node of a one-order higher unit than a unit having that first node. A second node of the each individual unit is connected to one of the first and second nodes provided in the one-order higher unit than the unit having that second node, the one being on the side connected to a resister section set to an impedance value 2Z. A hierarchical structure can be formed in which an opponent connection point of the second node is selected by a hierarchy switch section, whereby the each individual unit is parallel connected to the resister section provided in the one-order higher unit and set to the impedance value 2Z. In correspondence to an input first-order bit signal (D0), an analog signal voltage (AV) corresponding to an output code (1) of digital data is output from a lowest-order bit unit (LU). In this manner, the D-A conversion operation is performed.

17 Claims, 22 Drawing Sheets

PRINCIPLE DIAGRAM OF PRESENT INVENTION (OUTPUT CODE 0)

FIG. 1 PRINCIPLE DIAGRAM OF PRESENT INVENTION (OUTPUT CODE 0)

PRINCIPLE DIAGRAM OF PRESENT INVENTION (OUTPUT CODE 1)

PRINCIPLE DIAGRAM OF PRESENT INVENTION (OUTPUT CODE 2)

PRINCIPLE DIAGRAM OF PRESENT INVENTION (OUTPUT CODE 3)

PRINCIPLE DIAGRAM OF PRESENT INVENTION (OUTPUT CODE 4)

PRINCIPLE DIAGRAM OF PRESENT INVENTION (OUTPUT CODE 5)

PRINCIPLE DIAGRAM OF PRESENT INVENTION (OUTPUT CODE 6)

PRINCIPLE DIAGRAM OF PRESENT INVENTION (OUTPUT CODE 7)

FIG. 9 DIGITAL-ANALOG CONVERTER CIRCUIT 1 DIRECTED TO FIRST EMBODIMENT

EQUIVALENT CIRCUIT OF DIGITAL-ANALOG CONVERTER CIRCUIT 1

FIG. 11 TABLE SHOWING RELATION OF CODE SETTING FOR DIGITAL SIGNAL AND CONTROL STATE OF EACH SWITCH

| CODE | DIGITAL SIGNAL | | | | LOWEST-ORDER BIT UNIT LU | | | | FIRST ORDER HIERARCHY CONNECTOR SWITCH SECTION NS1 MIDDLE-ORDER BIT UNIT IU1 | | SECOND ORDER HIERARCHY CONNECTOR SWITCH SECTION NS2 MIDDLE-ORDER BIT UNIT IU2 | | THIRD ORDER HIERARCHY CONNECTOR SWITCH SECTION NS3 HIGHEST-ORDER BIT UNIT MU | |
|---|---|---|---|---|---|---|---|---|---|---|---|---|---|---|
| | D3 | D2 | D1 | D0 | OSW1 | OSW2 | OSW3 | OSW4 | SW1 SW12 SW13 | SW4 SW15 SW16 | SW11 SW22 SW23 | SW14 SW25 SW26 | SW21 SW32 SW33 | SW24 SW35 SW36 |
| 0 | L | L | L | L | ON | OFF | OFF | OFF | ON | OFF | ON | OFF | ON | OFF |
| 1 | L | L | L | H | OFF | ON | OFF | OFF | ON | OFF | ON | OFF | ON | OFF |
| 2 | L | L | H | L | OFF | OFF | ON | OFF | OFF | ON | ON | OFF | ON | OFF |
| 3 | L | L | H | H | OFF | OFF | OFF | ON | OFF | ON | ON | OFF | ON | OFF |
| 4 | L | H | L | L | ON | OFF | OFF | OFF | OFF | ON | ON | OFF | ON | OFF |
| 5 | L | H | L | H | OFF | ON | OFF | OFF | OFF | ON | OFF | ON | ON | OFF |
| 6 | L | H | H | L | OFF | OFF | ON | OFF | ON | OFF | OFF | ON | ON | OFF |
| 7 | L | H | H | H | OFF | OFF | OFF | ON | ON | OFF | OFF | ON | ON | OFF |
| 8 | H | L | L | L | ON | OFF | OFF | OFF | OFF | ON | OFF | ON | OFF | ON |
| 9 | H | L | L | H | OFF | ON | OFF | OFF | OFF | ON | OFF | ON | OFF | ON |
| 10 | H | L | H | L | OFF | OFF | ON | OFF | ON | OFF | OFF | ON | OFF | ON |
| 11 | H | L | H | H | OFF | OFF | OFF | ON | ON | OFF | OFF | ON | OFF | ON |
| 12 | H | H | L | L | ON | OFF | OFF | OFF | OFF | ON | ON | OFF | OFF | ON |
| 13 | H | H | L | H | OFF | ON | OFF | OFF | OFF | ON | ON | OFF | OFF | ON |
| 14 | H | H | H | L | OFF | OFF | ON | OFF | ON | OFF | ON | OFF | OFF | ON |
| 15 | H | H | H | H | OFF | OFF | OFF | ON | ON | OFF | ON | OFF | OFF | ON |

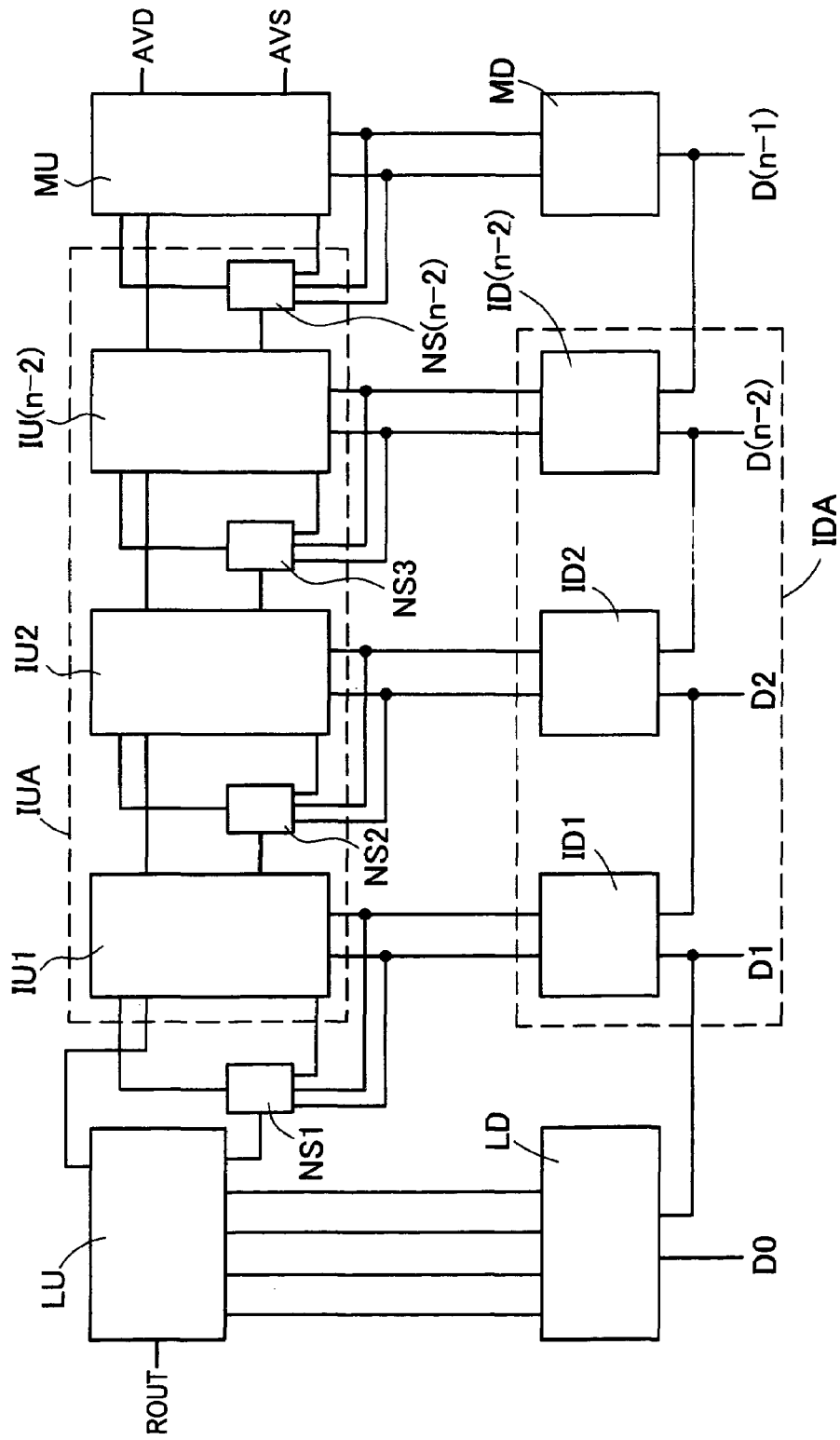
FIG. 12 CIRCUIT DIAGRAM IN CASE NUMBER OF BITS FOR DIGITAL SIGNAL IS INCREASED

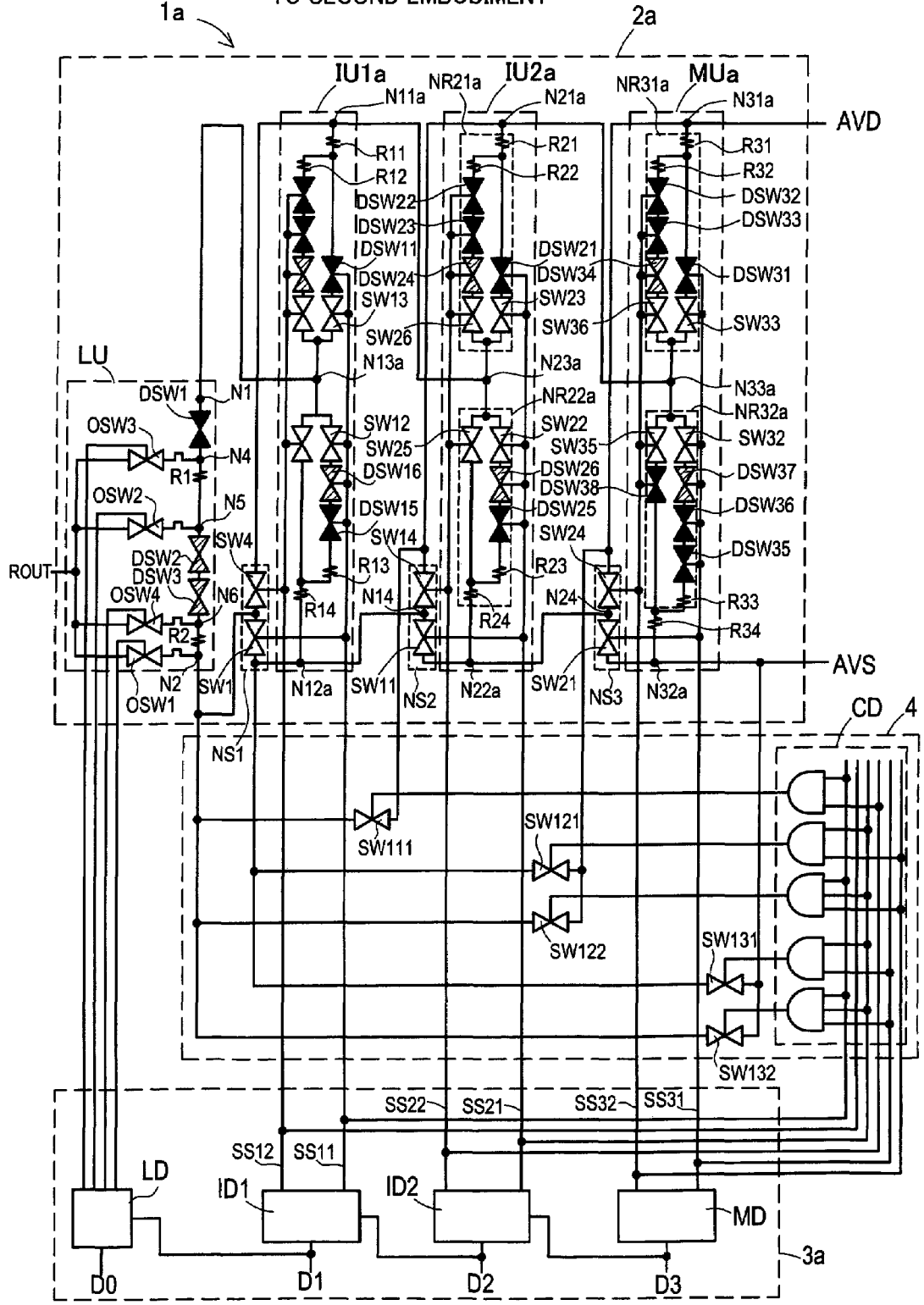
FIG. 13 DIGITAL-ANALOG CONVERTER CIRCUIT 1a DIRECTED TO SECOND EMBODIMENT

DIAGRAM IN CASE CORRECTION RESISTORS ARE INSERTED

EQUIVALENT CIRCUIT IN CASE CODE 1 IS INPUTTED

EQUIVALENT CIRCUIT IN CASE CODE 6 IS INPUTTED

FIG. 17  TABLE SHOWING RELATION OF CODE SETTING FOR DIGITAL SIGNAL AND CORRECTION SWITCH, IN DIGITAL-ANALOG CONVERTER CIRCUIT 1a

| CODE | DIGITAL SIGNAL | | | | HIERARCHY CONNECTOR SWITCH SEC. | | | | FOURTH CORRECTION SW. | | | | | |
|---|---|---|---|---|---|---|---|---|---|---|---|---|---|---|
| | D3 | D2 | D1 | D0 | SW1 | SW11 | SW21 | SW111 | SW121 | SW122 | SW131 | SW132 | | |
| 0 | L | L | L | L | ON | ON | ON | OFF | OFF | OFF | ON | ON | | |
| 1 | L | L | L | H | ON | ON | ON | OFF | OFF | OFF | ON | ON | | |
| 2 | L | L | H | L | OFF | ON | ON | OFF | OFF | OFF | ON | OFF | | |
| 3 | L | L | H | H | OFF | ON | ON | OFF | OFF | OFF | ON | OFF | | |
| 4 | L | H | L | L | OFF | OFF | ON | ON | OFF | OFF | OFF | OFF | | |
| 5 | L | H | L | H | OFF | OFF | ON | ON | OFF | OFF | OFF | OFF | | |
| 6 | L | H | H | L | ON | OFF | ON | ON | OFF | OFF | OFF | OFF | | |
| 7 | L | H | H | H | ON | OFF | OFF | OFF | OFF | OFF | OFF | OFF | | |
| 8 | H | L | L | L | ON | OFF | OFF | OFF | OFF | OFF | OFF | OFF | | |
| 9 | H | L | L | H | OFF | OFF | OFF | OFF | OFF | OFF | OFF | OFF | | |
| 10 | H | L | H | L | OFF | ON | OFF | OFF | ON | OFF | OFF | OFF | | |
| 11 | H | L | H | H | OFF | ON | OFF | OFF | ON | OFF | OFF | OFF | | |
| 12 | H | H | L | L | OFF | ON | OFF | OFF | ON | ON | OFF | OFF | | |
| 13 | H | H | L | H | OFF | ON | OFF | OFF | ON | ON | OFF | OFF | | |
| 14 | H | H | H | L | ON | ON | OFF | OFF | OFF | OFF | OFF | OFF | | |
| 15 | H | H | H | H | ON | ON | OFF | OFF | OFF | OFF | OFF | OFF | | |

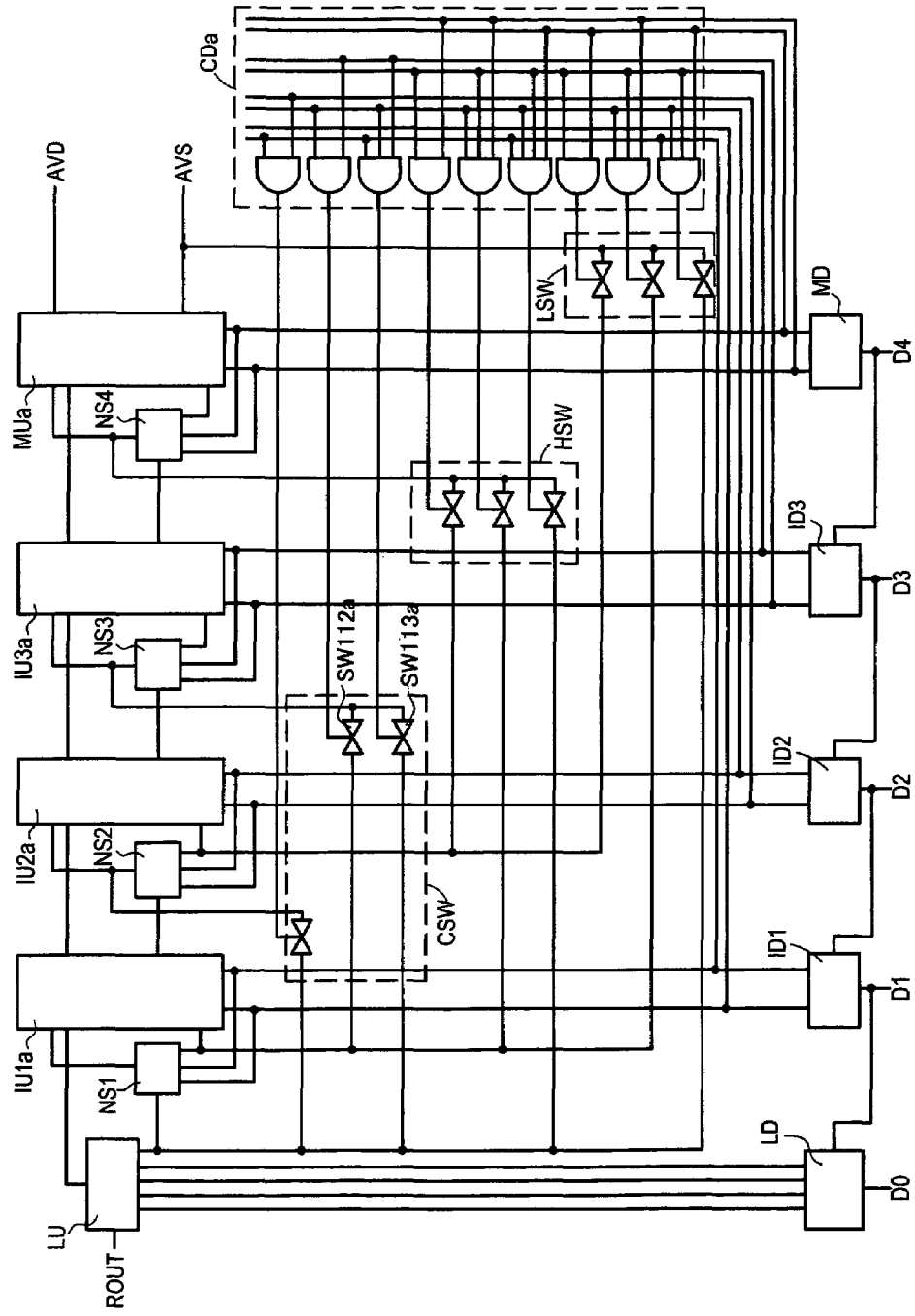
FIG. 18 DIAGRAM IN CASE NUMBER OF BITS IS INCREASED FOR DIGITAL-ANALOG CONVERTER CIRCUIT 1a

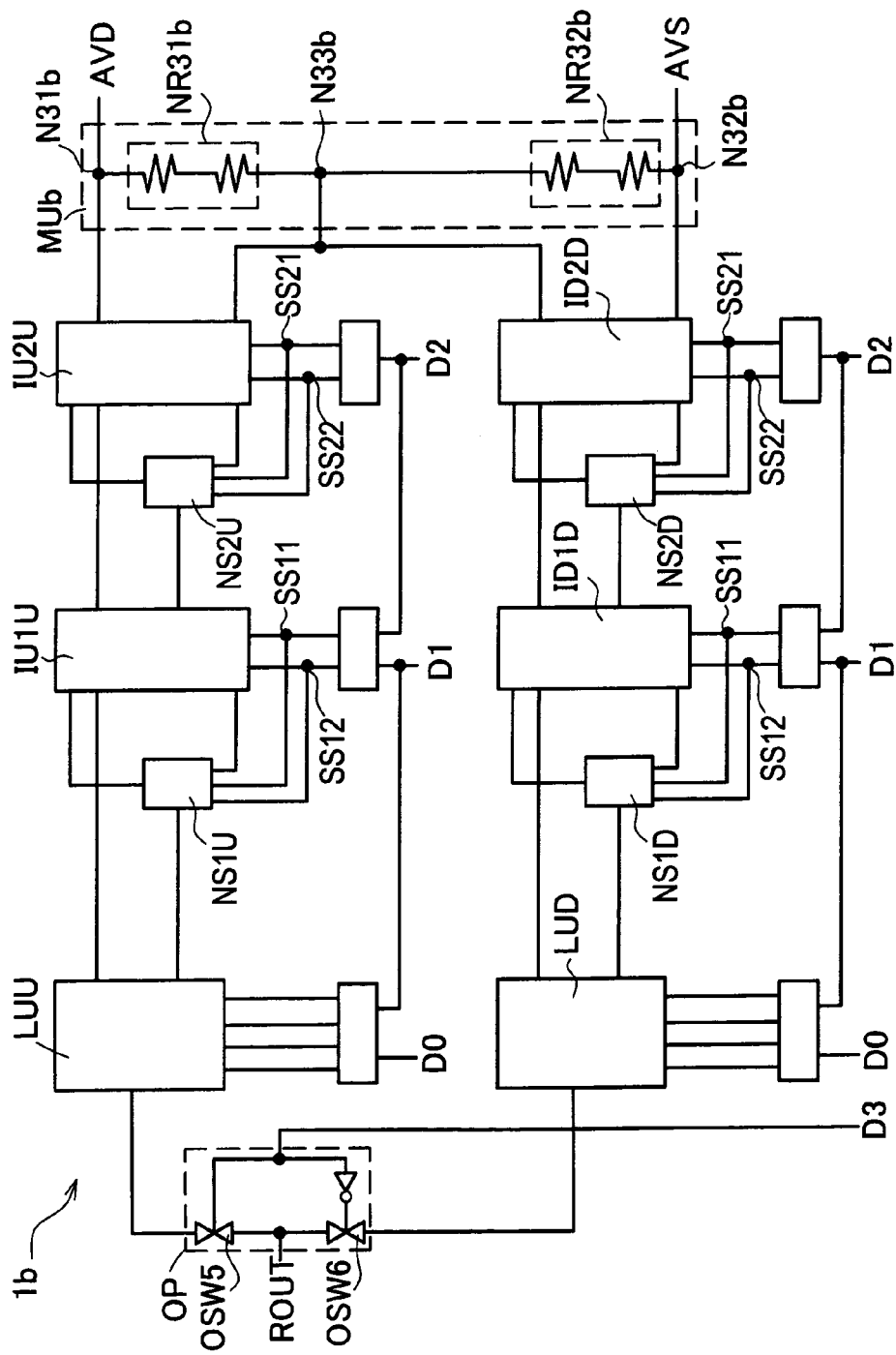
FIG. 19 DIGITAL-ANALOG CONVERTER CIRCUIT 1b DIRECTED TO THIRD EMBODIMENT

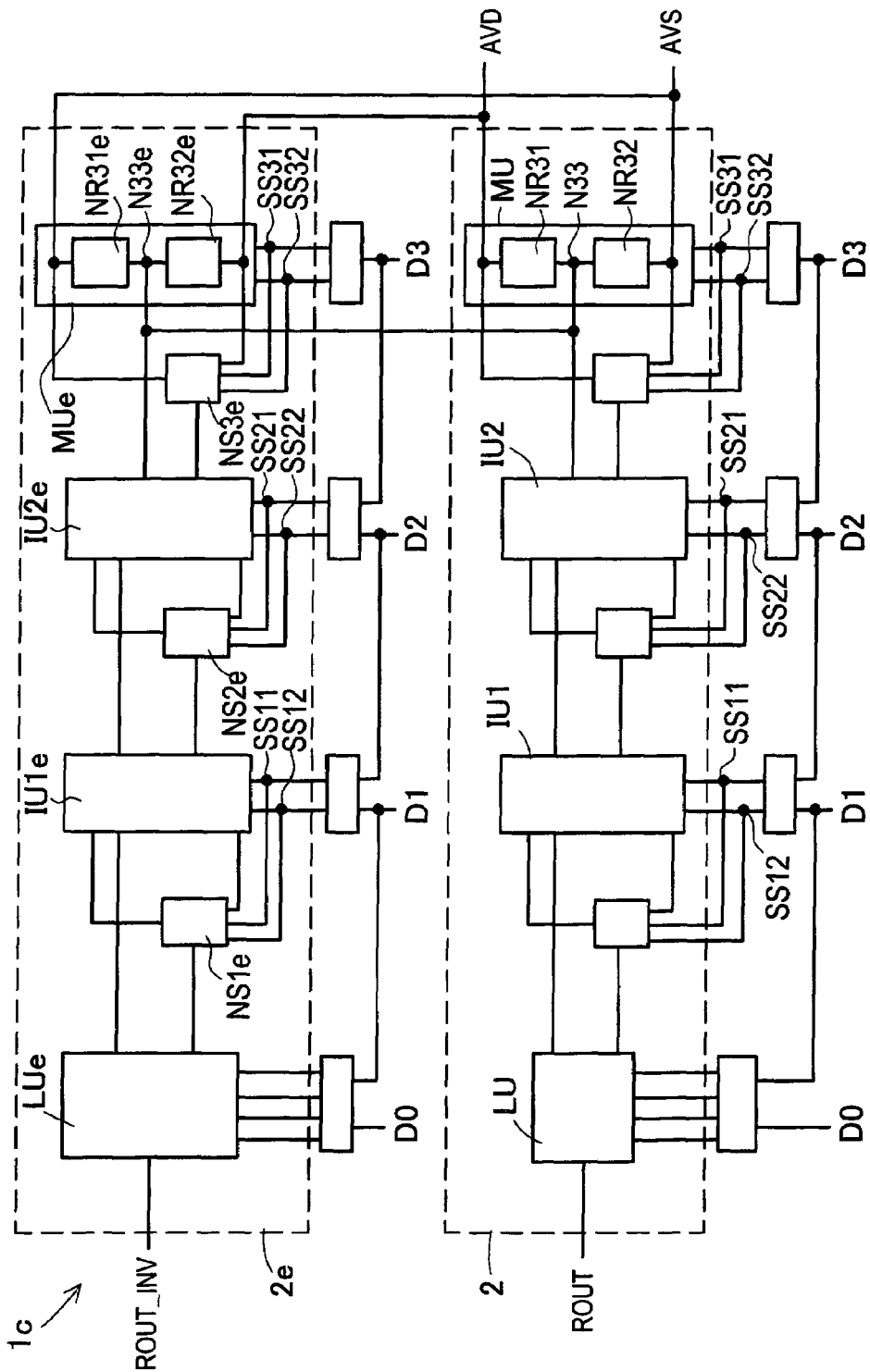
FIG. 20 DIGITAL-ANALOG CONVERTER CIRCUIT 1c DIRECTED TO FOURTH EMBODIMENT

DIAGRAM OF CONVENTIONAL THREE-BIT DIGITAL-ANALOG CONVERTER

DIAGRAM SHOWING RELATIONS OF OUTPUT CODES FOR DIGITAL SIGNALS AND ANALOG SIGNAL VOLTAGE

DIAGRAM SHOWING RELATIONS OF OUTPUT CODES FOR DIGITAL SIGNALS AND CURRENT CONSUMPTION

DIGITAL-ANALOG CONVERTER CIRCUIT

CROSS-REFERENCE TO RELATED APPLICATIONS

This application is based upon and claims the benefit of priority from the prior Japanese Patent Application No. 2004-180159 filed on Jun. 17, 2004, the entire contents of which are incorporated herein by reference.

BACKGROUND OF THE INVENTION

1. Field of the Invention

The present invention relates generally to digital-analog converter circuits. More specifically, the invention relates to a digital-analog converter circuit that is capable of obtaining a highly accurate analog signal and that is immune to the influence of device fluctuations.

2. Description of Related Art

As an example of conventional techniques on digital-analog converter circuits, Japanese Unexamined Patent Application Publication No. 10-154937 discloses a digital-analog converter circuit using an 8-bit ladder R-2R resistance network that produces an output with a combined voltage having a binary rate corresponding to a digital input signal. FIG. 21 shows a three-bit digital-analog converter circuit using an 8-bit ladder R-2R resistance network similar to the above. Digital signals D0 to D2 are input to a decoder section 100, wherein D0 represents a lowest-order bit and D2 represents a highest-order bit. In the decoder section 100, the connection to a high-level reference voltage AVD and a low-level reference voltage AVS is switched corresponding to the digital signals D0 to D2. An analog signal voltage AV, which is in the form of a converted analog signal, is output from an output terminal AOUT. Additionally, the relation between the output code of the digital signal and the analog signal voltage AV is shown in FIG. 22A. As is shown in FIG. 22A, the analog signal voltage AV, converted into the analog signal, is output in proportion to the output code.

SUMMARY OF THE INVENTION

FIG. 22B shows the relation between output codes and current consumption (consumptive current between high-level reference voltage AVD and the low-level reference voltage AVS). According to the conventional digital-analog converter circuit shown in FIG. 21, depending upon the output-code set value, fluctuations occurs in the consumptive current flowing between the high-level reference voltage AVD and the low-level reference voltage AVS, as is shown in FIG. 22B. As such, the digital-analog converter circuit is influenced by the variations and hence causes fluctuations, thereby potentially leading to the event of disabling an accurate analog signal voltage AV to be secured. On the other hand, when attempting to restrain such reference voltage fluctuations attributed to the consumptive current, the operation requires a reference power source having a relatively higher driving capacity. This requires a digital-analog converter circuit having an enlarged size, consequently disabling the implementation of power saving.

The present invention is made to solve problems with the conventional technique such as that described above. More specifically, an object of the invention is to provide a digital-analog converter circuit enabling, for example, gaining an improved accurate analog signal and preventing increase in the circuit size.

In order to achieve the object, a digital-analog converter circuit on a digital-analog converter circuit of x bits, according to the present invention, comprises a first order unit comprising a first resister section and corresponding to a lowest-order bit or a first-order bit signal; m-th order units (m=value from 2 to x) each comprising two second resister sections series connected at a middle node and each corresponding to an m-th bit signal, wherein when the m-th order bit signal is a first level, an impedance value of the second resister section connected to a first voltage side is set to a first impedance value, and an impedance value of the second resister section connected to a second voltage side is set to a second impedance value that is twice the first impedance value, and when the m-th order bit signal is a second level, the impedance value of the second resister section connected to the first voltage side is set to the second impedance value that is twice the first impedance value, and the impedance value of the second resister section connected to the second voltage side is set to the first impedance value; and a hierarchical structure wherein an (m−1)th unit is parallel connected to the second resister section of the m-th order unit that has been set to the second impedance value, and an x-th order unit is connected between the first reference voltage and the second reference voltage.

The digital-analog converter circuit of the present invention comprises the first order unit and the m-th order units (m=value from 2 to x). The first order unit comprises the first resister section and corresponds to the lowest-order bit or the first-order bit signal. The m-th order unit comprises two second resister sections series connected at the middle node and corresponds to the m-th bit signal. The (m−1)th order unit is parallel connected to the second resister section of the m-th order unit set to the second impedance value. Accordingly, the hierarchical structure is formed to have a configuration in which an x-th order unit is connected between the first reference voltage and the second reference voltage, whereby the first order unit to the (x−1)th order unit are parallel connected to the x-th order unit, i.e., a highest-order bit unit.

According to the functionality of the hierarchical structure described above, a combined impedance value between the first reference voltage and the second reference voltage is set to the second impedance value. When inter-unit connection in the circuit field from the first order unit to the (x−1)th order unit is changed, analog voltage values corresponding to individual output codes can be output from the first order unit. Consequently, the configuration operates as the digital-analog converter circuit. Even when the inter-unit connection is changed, the combined impedance value between the first reference voltage and the second reference voltage is maintained to stay at the second impedance value, which is preset as a constant value. Thereby, even when the output-code set values are changed, the current to be consumed between the first reference voltage and the second reference voltage is maintained constant at all times. This enables eliminating an undesired probability of reference voltage fluctuations that can occur upon being influenced by consumptive-current fluctuations, consequently enabling improved accurate analog signals (AV) to be secured.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 11 is a table showing relations between output code settings for digital signals and control states of individual switches;

FIG. 12 is a circuit diagram in case the number of bits for digital signals is increased;

FIG. 13 shows a digital-analog converter circuit 1a directed to a second embodiment;

FIG. 17 is a table showing relations between output code settings for digital signals and correction switch, in digital-analog converter circuit 1a;

FIG. 18 is a diagram in case the number of bits is increased for digital-analog converter circuit 1a;

FIG. 19 shows a digital-analog converter circuit 1b directed to a third embodiment;

FIG. 20 shows a digital-analog converter circuit 1c directed to a fourth embodiment;

DETAILED DESCRIPTION OF PREFERRED EMBODIMENTS

Particularized embodiments of digital-analog converter circuits according to the present invention will be described in detail below with reference to the drawings in FIGS. 1 to 20.

Figure 1:
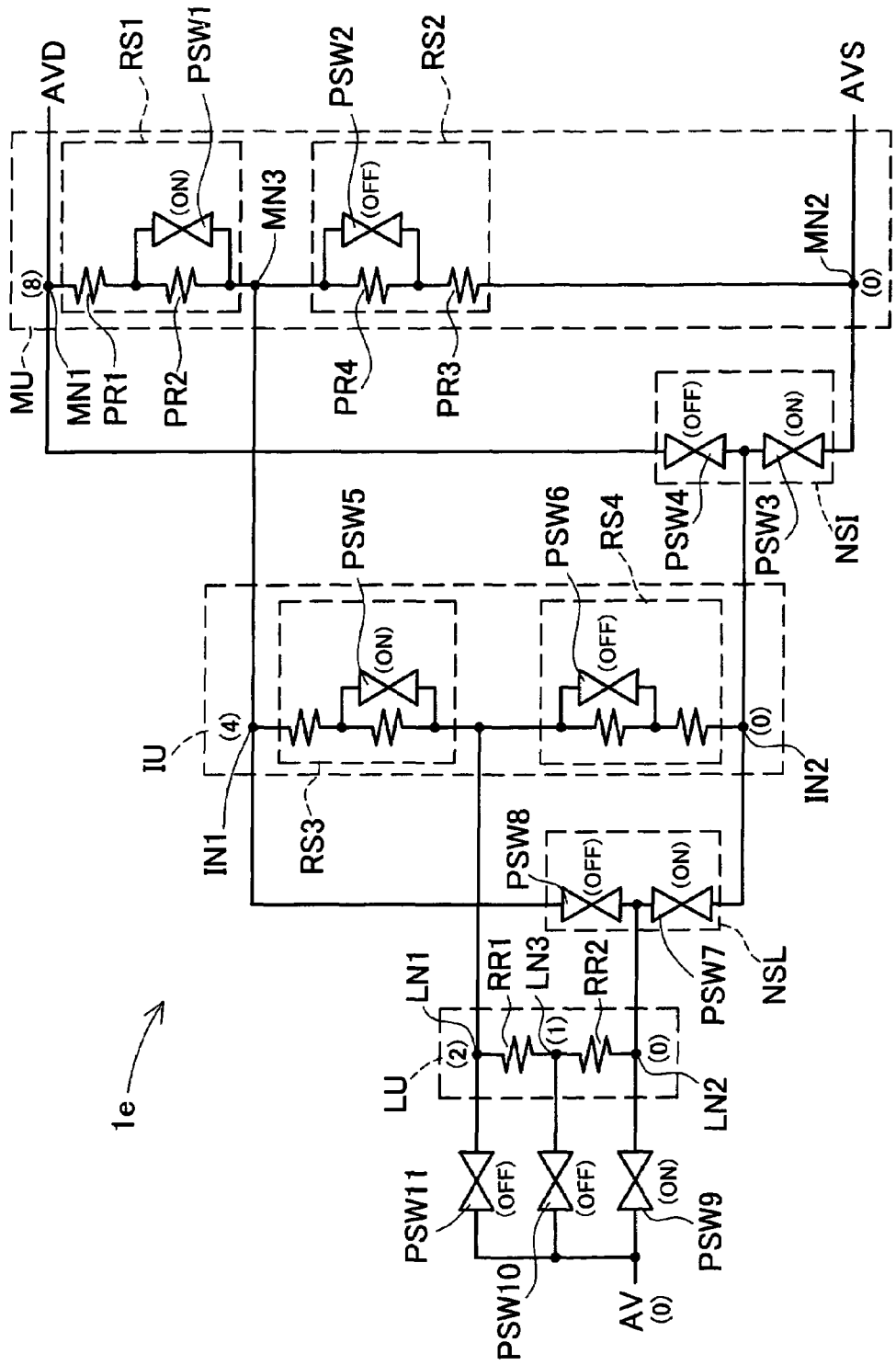
FIG. 1 shows a principle diagram (output code 0) of the present invention.
Figure 2:
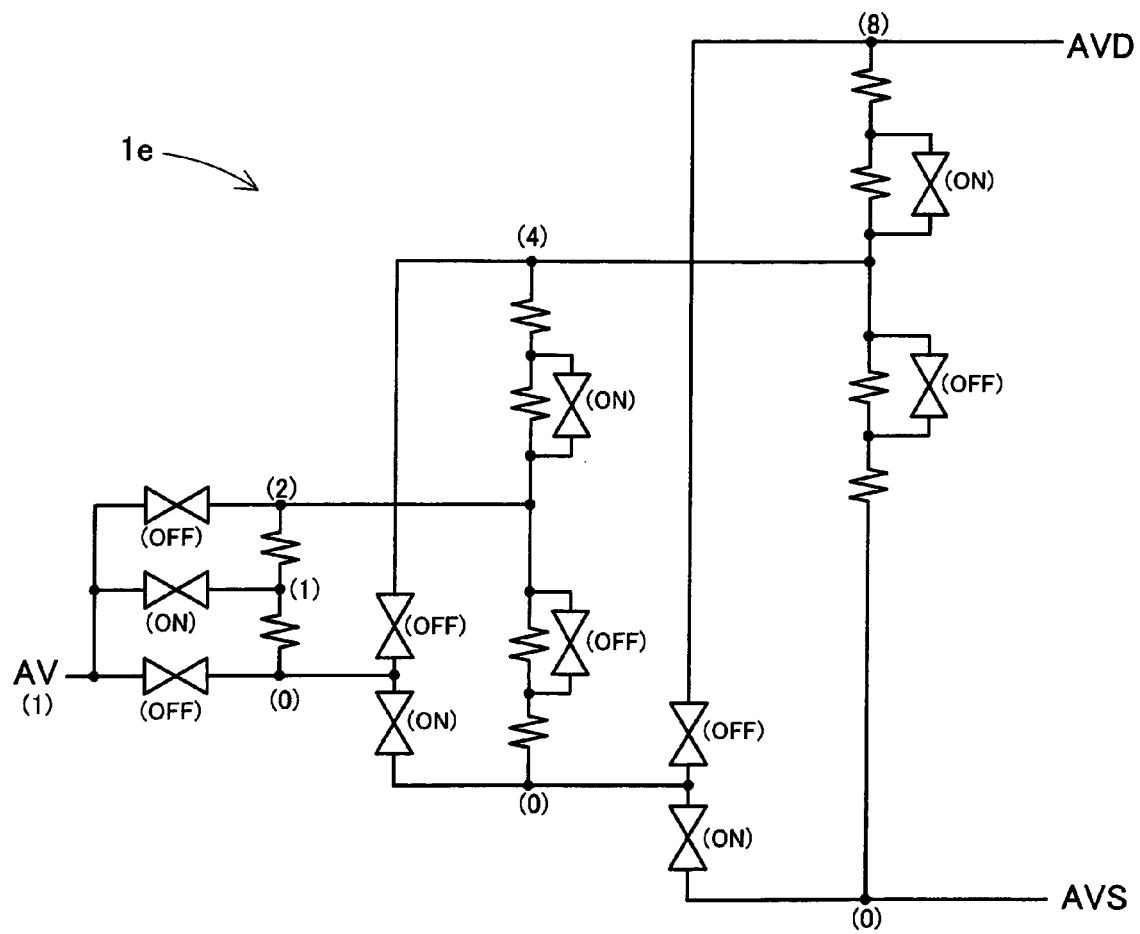
FIG. 2 is a principle diagram (output code 1) of the present invention.
Figure 3:
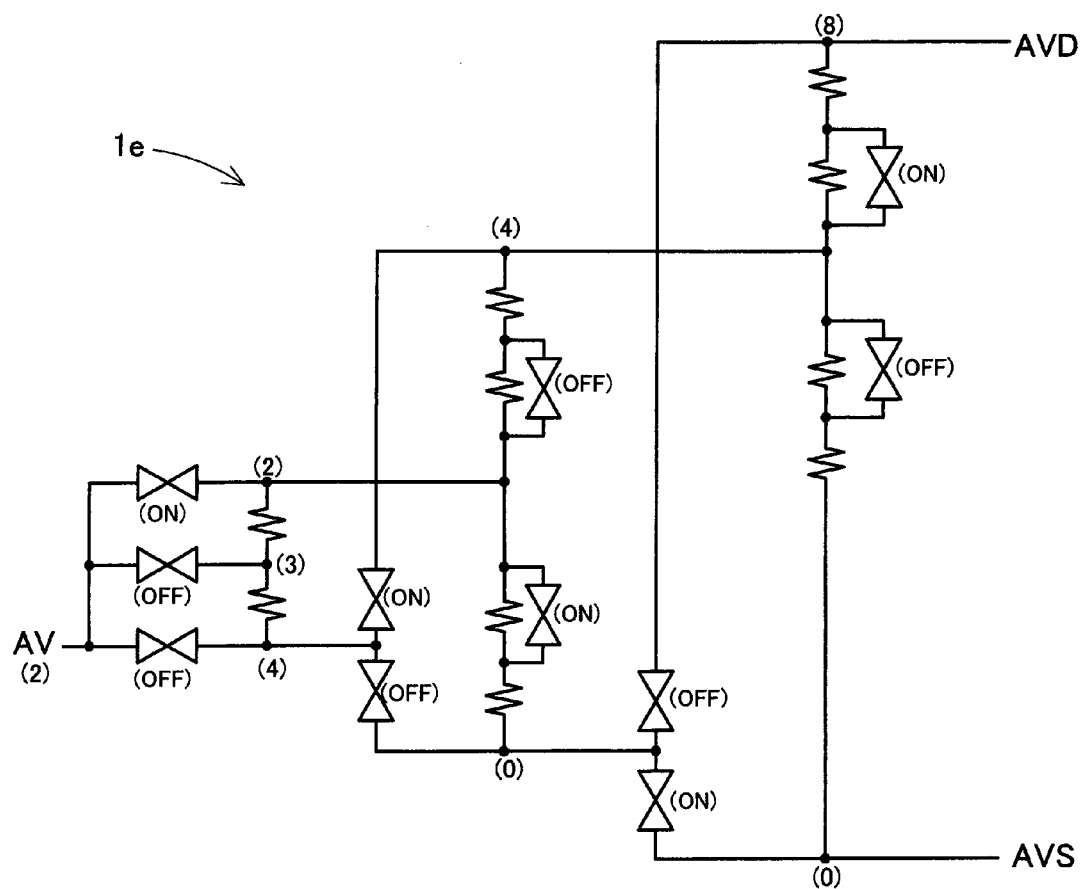
FIG. 3 is a principle diagram (output code 2) of the present invention.
Figure 4:
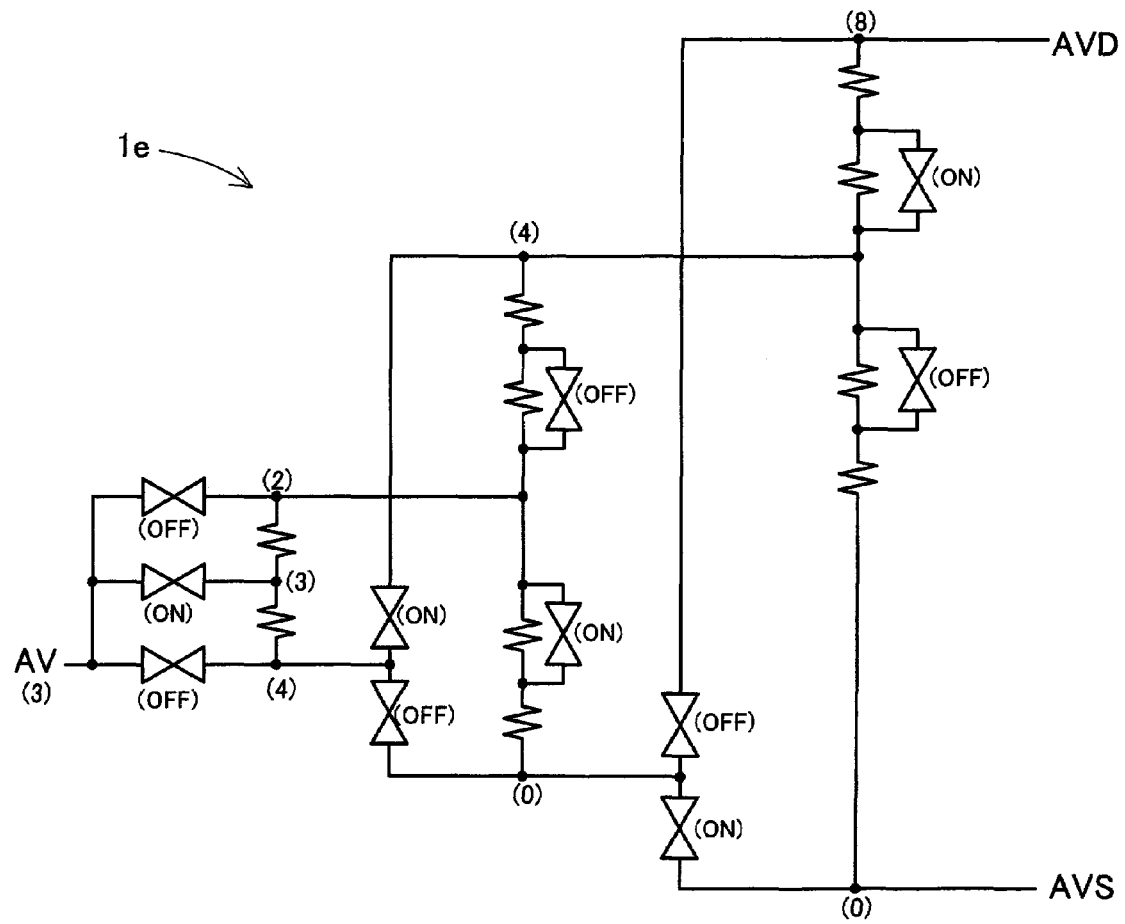
FIG. 4 is a principle diagram (output code 3) of the present invention.
Figure 5:
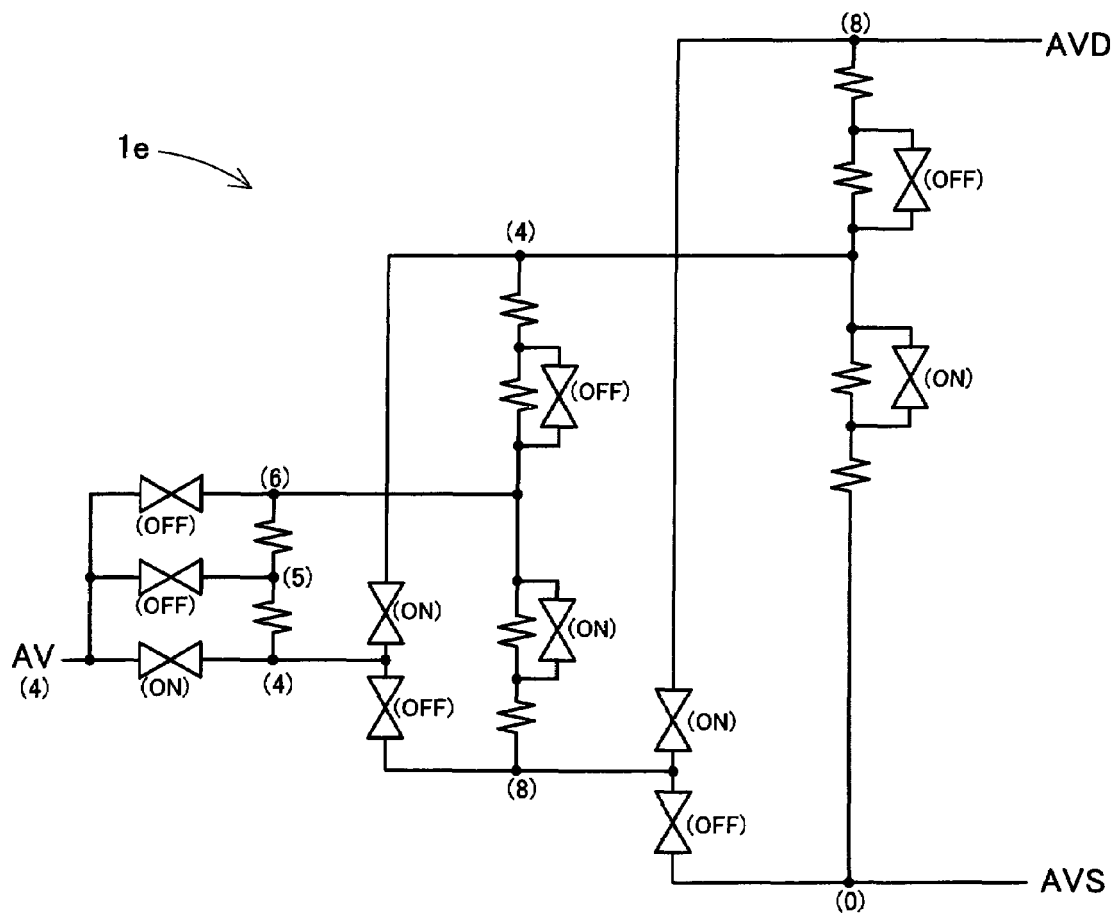
FIG. 5 is a principle diagram (output code 4) of the present invention.
Figure 6:
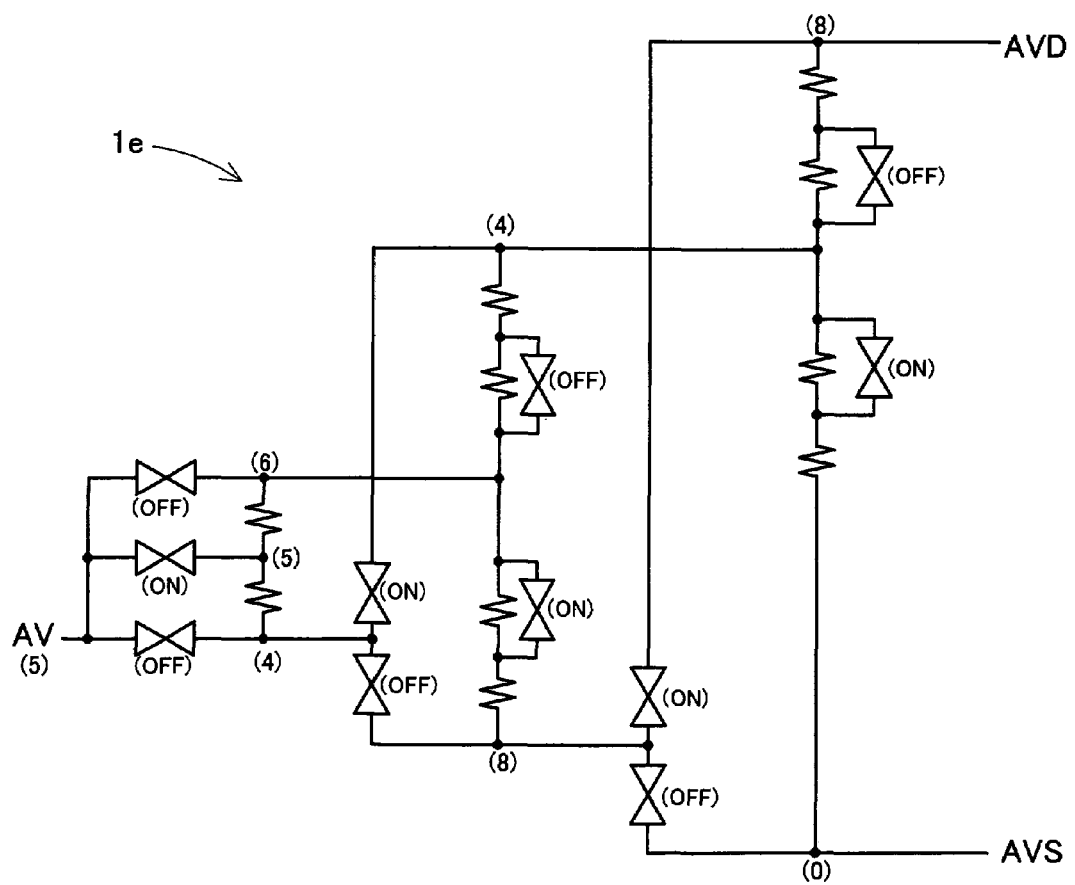
FIG. 6 is a principle diagram (output code 5) of the present invention.
Figure 7:
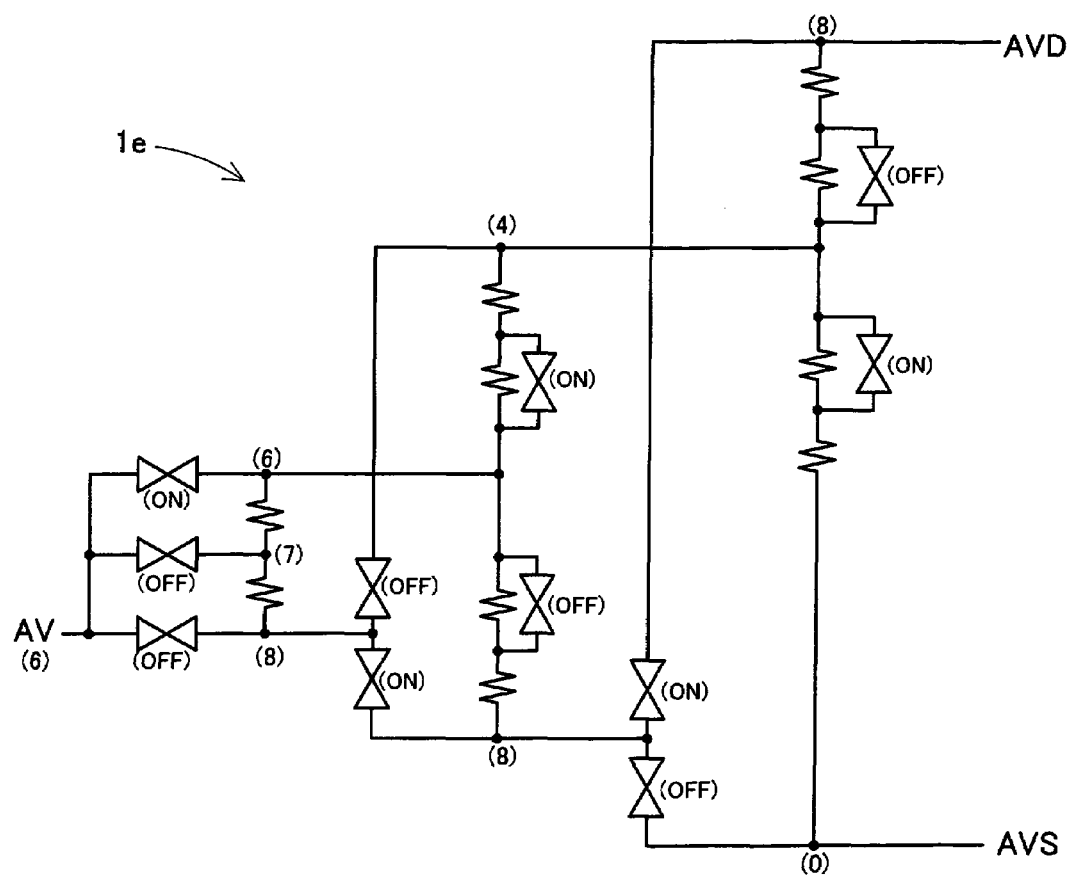
FIG. 7 is a principle diagram (output code 6) of the present invention.
Figure 8:
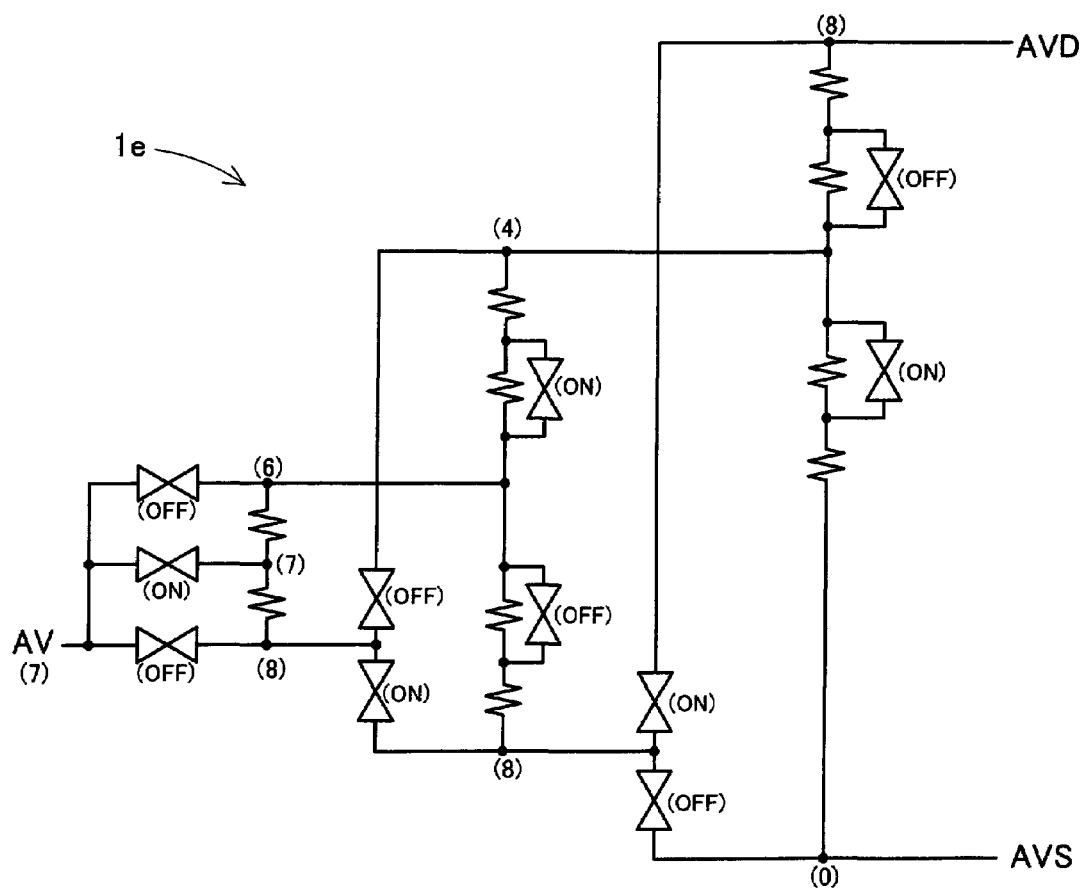
FIG. 8 is a principle diagram (output code 7) of the present invention.

FIGS. 1 to 8 individually show principle diagrams of the present invention; specifically, shown in the each drawing is a digital-analog converter circuit 1e for three-bit digital data. Referring first to FIG. 1, the digital-analog converter circuit 1e is configured of a lowest-order bit unit LU corresponding to lowest-order or first order bit signals, a middle-order bit unit IU corresponding to middle-order or second order bit signals, and highest-order bit unit MU corresponding to highest-order or third order bit signals.

The highest-order bit unit MU is provided with resister sections RS1 and RS2 series connected between a high-level reference voltage AVD and a low-level reference voltage AVS. The resister section RS1 has a first resistor PR1, a second resistor PR2, and a bypass-switching switch PSW1 parallel connected to the second resistor PR2. Similarly, the resister section RS2 has a first resistor PR3, a second resistor PR4, and a bypass-switching switch PSW2.

The middle-order bit unit IU is provided with resister sections PR3 and PR4 similar in configuration to the resister sections PR1 and PR2. A first node IN1 of the middle-order bit unit IU is connected to a middle node MN3 of the one-order higher or highest-order bit unit MU. A second node IN2 of the middle-order bit unit IU is connected to a first node MN1 and a second node MN2 of the highest-order bit unit IU via a hierarchy connector switch section NSI.

The lowest-order bit unit LU is provided with resistors RR1 and RR2. The resister sections RS1 to RS4 and resistors provided in the lowest-order bit unit LU are individually formed using reference resistors all having a same impedance value Z. A first node LN1, a second node LN2, and a middle node LN3 of the lowest-order bit unit LU are connected to a switch PSW11, a switch PSW9, and a switch PSW10, respectively. An analog signal voltage AV is output from the each individual switch. In the drawing figures, a numeral enclosed in parentheses at each node denotes an output code of digital data corresponding to a voltage value of the each node.

By reference to FIG. 1, the following will describe a case where third, second, and first order signals of a digital signal to be input are, respectively, "L (low), L, L" levels (output code 0). The bypass-switching switch PSW2 of the resister section RS2 of the highest-order bit unit MU is turned to the OFF state in correspondence to the low-level third order bit signal. Thereby, the impedance of the resister section RS2 is set to an impedance value 2Z. Concurrently, the bypass-switching switch PSW1 of the resister section RS1 is turned to the ON state. Thereby, the second resistor PR2 becomes negligible, and the impedance of the resister section RS1 is set to the impedance value Z. Concurrently, a bypass-switching switch PSW3 of the hierarchy connector switch section NSI is turned to the ON state. Thereby, a bypass-switching switch PSW4 of the switch section NSI is turned to the OFF state, and the middle-order bit unit IU is parallel connected to the resister section RS2 of the highest-order bit unit MU, which has been set to the impedance value 2Z.

A bypass-switching switch PSW6 of the resistance section RS4 of the middle-order bit unit IU is turned to the OFF state in correspondence to the low-level second order bit signal. Thereby, the impedance of a resister section RS4 is set to the impedance value 2Z. Concurrently, a bypass-switching switch PSW5 of the resister section RS3 is turned to the ON state. Thereby, the impedance of the resister section RS3 is set to the impedance value Z. Concurrently, a bypass-switching switch PSW7 of a hierarchy connector switch section NSL is turned to the ON state, and a bypass-switching switch PSW8 of the switch section NSL is turned to the OFF state. Thereby, the lowest-order bit unit LU is parallel connected to the resister section RS4 of the highest-order bit unit MU, which has been set to the impedance value 2Z.

An output code 8 of digital data corresponds to the high-level reference voltage AVD, and an output code 0 corresponds to the low-level reference voltage AVS, as shown in FIG. 1. Accordingly, the voltage value of the first node IN1 of the middle-order bit unit IU corresponds to an output code 4. The voltage value of the first node LN1 of the lowest-order bit unit LU corresponds to an output code 2, the voltage value of the second node LN2 corresponds to the output code 0, and the voltage value of the middle node LN3 corresponds to an output code 1. In correspondence to the low-level first order bit signal, the switch PSW9 is turned to the ON state, and the switches PSW10 and PSW11 are each turned to the OFF state, whereby to select the voltage value of the second node LN2 and produces the output as being an analog signal voltage AV. Consequently, an analog voltage corresponding to the digital-data output code 0 is output. In this manner, a digital-analog conversion operation is executed.

In this event, in the digital-analog converter circuit 1e, a hierarchical structure is formed in the manner that the one-order lower unit is parallel connected to the resister section having been set to the impedance value 2Z. Then, a sum of the impedance values of resistors RR1 and RR2 of the lowest-order bit unit LU is combined with the impedance of the resister RS4 whereby to acquire a combined impedance. In this case, the combined impedance value is Z. Similarly, the total value of the above-acquired impedance value Z and the impedance of the resister section RS3 is combined with the impedance of the resister section RS2, whereby to acquire a combined impedance. In this case, the value of the combined impedance value is Z. Accordingly, the combined impedance between the high-level reference voltage AVD and the low-level reference voltage AVS takes the value 2Z.

Figure 22A:
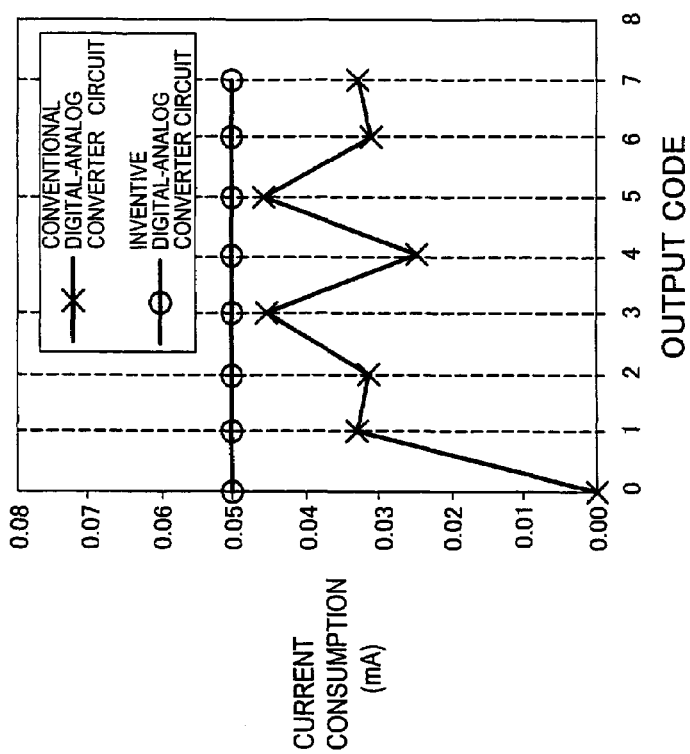
FIG. 22A is a diagram showing relations of output codes for digital signals and analog signal voltage.
Figure 22B:
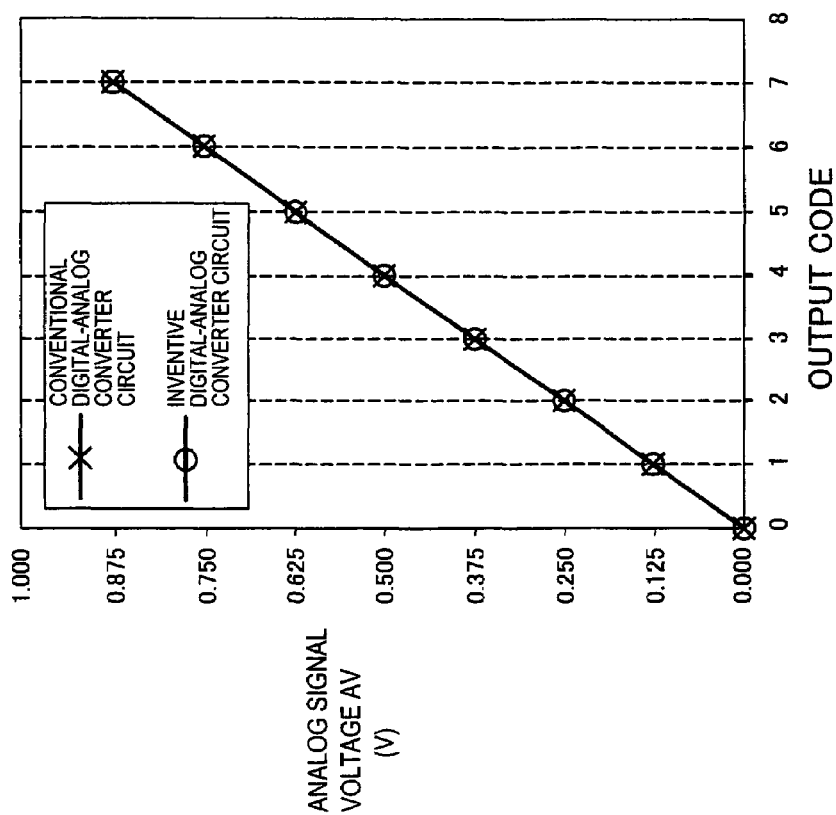
FIG. 22B is a diagram showing relations of output codes for digital signals and current consumption.

FIGS. 2 to 8 each depict a drawing figure of a connection state of the digital-analog converter circuit 1e when digital signals corresponding to output codes 1 to 7 are input. With reference to each of FIGS. 2 to 8, bypass-switching switches and connector switches of hierarchy connector switches are individually switched corresponding to the output codes 1 to 7, and a hierarchical structure is formed. Thereby, an analog signal voltage AV corresponding to the individual output codes can be acquired. Thereby, the digital-analog converter circuit 1e operates as being a three-bit digital-analog converter. Similar to the case of FIG. 1, also in each of the cases of FIGS. 2 to 8 (output codes 1 to 7), the combined impedance value between the high-level reference voltage AVD and the low-level reference voltage AVS is maintained at the constant impedance value 2Z. Consequently, as shown in FIG. 22B, even in the event the output-code set values are changed, there do not occur fluctuations in the consumptive current flowing between the high-level reference voltage AVD and the low-level reference voltage AVS.

Thus, even when the output codes are changed, the current consumed between the high-level reference voltage AVD and the low-level reference voltage AVS is all time constant. Consequently, fluctuations in the reference voltages power can be prevented from being caused by the influence of consumptive-current fluctuations, thereby enabling an accurate analog signal voltage AV to be acquired. Further, such countermeasure is taken against consumptive-current fluctuations, a reference power source having a large drive capacity need not be provided, so that circuit simplification and circuit miniaturization can be implemented.

Figure 9:
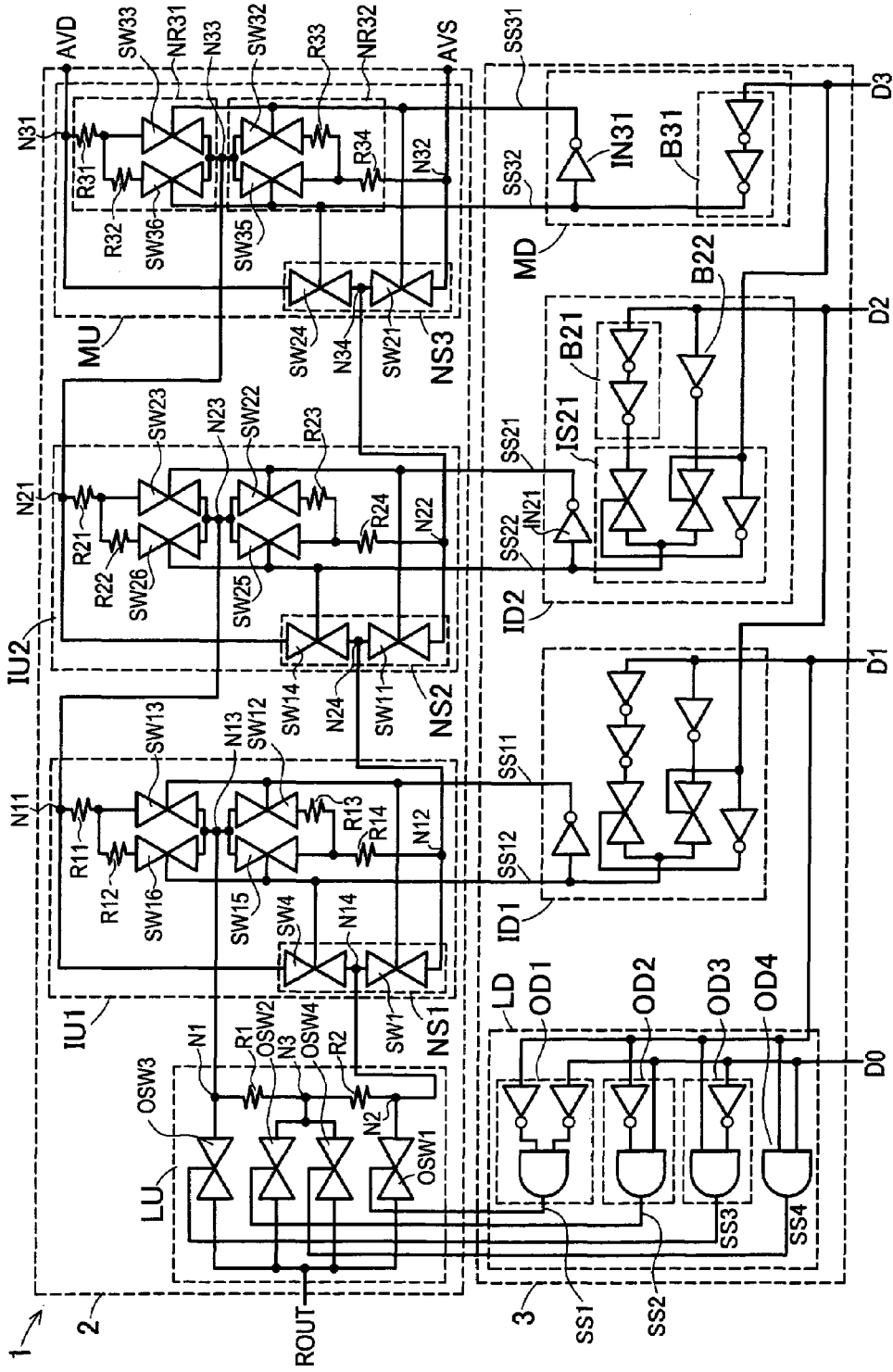
FIG. 9 shows a digital-analog converter circuit 1 directed to the first embodiment.

Particularized embodiments of the signal detector circuit according to the present invention will be described in detail here with reference to the drawings. Referring first to FIGS. 9 to 12, a first embodiment of the invention will be described. FIG. 9 shows a digital-analog converter circuit 1 for four-bit digital data in accordance with the first embodiment. The digital-analog converter circuit 1 is provided with a converter section 2 and a decoder section 3. The converter section 2 is provided with a lowest-order bit unit LU corresponding to a first order unit, a middle-order bit unit IU1 corresponding to a second order unit, a middle-order bit unit IU2 corresponding to a third order unit, and a highest-order bit unit MU corresponding to a fourth order unit. The first to third order units have first to third order hierarchy connector switch sections NS1 to NS3, respectively. The highest-order bit unit MU is connected to the high-level reference voltage AVD and the low-level reference voltage AVS. An output terminal of the lowest-order bit unit LU is connected to an analog-signal output terminal ROUT. In addition, the decoder section 3 has a lowest-order bit decoder LD corresponding to a first (lowest)-order bit signal D0, a middle-order bit decoder ID1 corresponding to a second order bit signal, a middle-order bit decoder ID2 corresponding to a third(middle)-order bit signal, and a highest-order bit decoder MD corresponding to a fourth (highest)-order bit signal. Every switch provided in the converter section 2 and the decoder section 3 is formed using a transfer gate. The switch becomes conductive in response to an input high level signal and becomes nonconductive in response to an input low level signal.

The configuration of the highest-order bit unit MU will be described here. The highest-order bit unit MU is provided with bypass-switching switches SW33 and SW35, first correction switches SW32 and SW36, first resistors R31 and R34, and second resistors R32 and R33. A first node N31 of the highest-order bit unit MU is connected to the high-level reference voltage AVD, and a second node N32 is connected to the low-level reference voltage AVS. All the resistors R31 to R34 are formed using reference resistors having the same impedance value Z. The bypass-switching switch SW33 is parallel connected the resistor R32 and the first correction switch SW36. The first resistor R31, the second resistor R32, the bypass-switching switch SW33, and the first correction switch SW36 constitute a first node resistor section NR31 connected to the first node. Similarly, the first resistor R34, the second resistor R33, the bypass-switching switch SW35, and the first correction switch SW32 constitute a second node resistor section NR32 connected to the second node. The first node resistor section NR31 and the second node resistor section NR32 are series connected through a middle node N33.

The middle node N33 of the highest-order bit unit MU is connected to a first node N21 of the middle-order bit unit IU2. The first and second nodes N31 and N32 are connected to connector switches SW24 and SW21 of the hierarchy connector switch sections NS3, respectively. A node N34 positioned in a middle portion between the connector switches SW24 and SW21 is connected to a second node N22 of the middle-order bit unit IU2. The configuration of each of the middle-order bit units IU1 and IU2 is similar to that of the highest-order bit unit MU, so that detailed descriptions thereof are omitted herefrom.

The configuration of the lowest-order bit unit LU will be described here. A resistor R1 is connected between a first node N1 and a middle node N3, and a resistor R2 is connected between a second node N2 and the middle node N3. The first node N1 is connected to a middle node N13 of the middle-order bit unit IU1, and the second node N2 is connected to a node N14 of the first hierarchy connector switch sections NS1. The second node N2 is connected to a first node N11 of the middle-order bit unit IU1 when a connector switch SW4 is in a conductive state and a connector switch SW1 is in a nonconductive state. In addition, the second node N2 is connected to a second node N12 of the middle-order bit unit IU1 when the connector switch SW4 is nonconductive and the connector switch SW1 is conductive. Other components of the lowest-order bit unit LU are connected as: the first node N1 to a switch OSW3, the middle node N3 to switches OSW2 and OSW4, the second node N2 to a switch OSW1, and output terminals of the switches OSW1 to OSW4 to the analog-signal output terminal ROUT.

Connection configurations between the individual units will be described here. The respective first nodes N1, N111, N21, provided in the lowest-order bit unit LU, the middle-order bit unit IU1, and the middle-order bit unit IU2, are connected to the middle nodes N13, N23, and N33 provided in the one-order higher units. The second node N2 of the lowest-order bit unit LU is connected to the first and second nodes N11 and N12 of the middle-order bit unit IU1 through the hierarchy connector switch section NS1. The second node N12 of the middle-order bit unit IU1 is connected to the first and second nodes N21 and N22 of the middle-order bit unit IU1 through the hierarchy connector switch section NS2. The second node N22 of the middle-order bit unit IU2 is connected to the first and second nodes N31 and N32 of the highest-order bit unit MU through the hierarchy connector switch section NS3.

The configuration of the highest-order bit decoder MD provided in the decoder section 3 will be described here. The highest-order bit or fourth order bit signal D3 is input to a buffer B31. A switch-switching signal SS32 is output from the buffer B31, and is input to the connector switch SW24 of the hierarchy connector switch section NS3, the bypass-switching switch SW35, and the first correction switch SW36 of the highest-order bit unit MU. In addition, the switch-switching signal SS32 is input to an inverter IN31. The switch-switching signal SS31 having been output from the inverter IN31 is input to the connector switch SW21 of the hierarchy connector switch section NS3, the first correction switch SW32, and the bypass switch SW33 of the highest-order bit unit MU.

The configuration of the middle-order bit decoder ID2 will be described here. The third order bit signal D2 is input to the individual buffers B21 and B22. Output signals of the buffers B21 and B22 and the fourth order bit signal D3 are input to an input selector section IS21. A switch-switching signal SS22 is output from the input selector section IS21, and is input to a connector switch SW14 of the hierarchy connector switch sections NS2 and to a bypass-switching switch SW25 and a first correction switch SW26 of the middle-order bit unit IU2. The switch-switching signal SS22 is input to an inverter IN21. A switch-switching signal SS21 having been output from the inverter IN21 is input to a connector switch SW11 of the hierarchy connector switch sections NS2, a first correction switch SW22 and a bypass-switching switch SW23 of the middle-order bit unit IU2. The middle-order bit decoder ID2 also has a configuration similar to the middle-order bit decoder ID1, so that detailed description thereof is omitted herefrom.

The configuration of the lowest-order bit decoder LD will be described here. The lowest-order bit decoder LD is provided with output decoders OD1 to OD4 that each input the lowest-order bit signal D0 and the middle-order bit signal D1. Switch-switching signals SS1 to SS4 to be output from the output decoder OD1 to OD4 are input to the switches OSW1 to OSW4 of the lowest-order bit unit LU, respectively.

Operation of the digital-analog converter circuit 1 shown in FIG. 9 will now be described with reference to an example case where digital signals D3, D2, D1, and D0 at "L", "L", "L", "H (high)" levels (output code 1) are input. The case will be described not taking into account ON resistances of the individual switches. When the low-level fourth order bit signal D3 is input to the highest-order bit decoder MD, the operation outputs a high-level switch-switching signal SS31 and a low-level switch-switching signal SS32. In the first node resistor section NR31, the bypass switch SW33 becomes conductive in response to the high-level switch-switching signal SS31. Concurrently, the first correction switch SW36 becomes nonconductive in response to the low-level switch-switching signal SS32. Thereby, the resistor section NR31 is placed in the state where one resistor, namely the first resistor R31, is connected, and hence the impedance is set to the impedance value Z. In the second node resistor section NR32, the first correction switch SW32 becomes conductive, and the bypass-switching switch SW35 becomes nonconductive. Thereby, the resistor section NR32 is placed into the state where two resistors, namely, the resistors R33 and R34, are connected, and hence the impedance is set to the impedance value 2Z. Additionally, the connector switch SW21 becomes conductive in response to the high-level switch-switching signal SS31, whereby the second node N22 of the middle-order bit unit IU2 is connected to the second node N32 of the highest-order bit unit MU.

The following will describe the operation of the first correction switch SW36. The first correction switch SW36 performs inverse operation with respect to the bypass switch SW33. Specifically, in response to corresponding bit signal, when the first correction switch SW36 becomes conductive, the bypass switch SW33 becomes nonconductive. Conversely, when the first correction switch SW36 becomes nonconductive, the bypass switch SW33 becomes conductive.

The high-level first order bit signal D0 and the low-level second order bit signal D1 are input to the lowest-order bit decoder LD. In response, the lowest-order bit decoder LD outputs a high-level switch-switching signal SS2 and low-level switch-switching signals SS1, SS3, and SS4. Thereby, in the lowest-order bit unit LU, the switch OSW2 becomes conductive, and the switches OSW1, OSW3, and OSW4 are turned to the nonconductive states, respectively. Consequently, the voltage value of the node N3 is output in the form of an analog signal voltage AV.

The following will now describe a hierarchical structure formed of connections from the lowest-order bit unit LU to the highest-order bit unit MU. The first node of the each individual unit is connected to the middle node of the one-order higher unit. The each individual second node is connected to one of the first and second nodes provided in the one-order higher unit than the unit having that second node, the one being on the side connected to the resister section set to the impedance value 2Z. More specifically, in FIG. 9, the second node N2 of the lowest-order bit unit LU is connected to the second node N12 of the middle-order bit unit IU1 through the hierarchy connector switch section NS1. Similarly, the second node N12 of the middle-order bit unit IU1 is connected to the second node N22 of the middle-order bit unit IU2 through the hierarchy connector switch sections NS2. Further, the second node N22 of the middle-order bit unit IU2 is connected to the second node N32 of the highest-order bit unit MU through the hierarchy connector switch section NS3. Thereby, a hierarchical structure can be formed in which the opponent connection point of the first node (i.e., a node to which the first node is connected) of the each individual unit is fixed at the middle node of the one-order higher unit, and the opponent connection point of the second node (i.e., a node to which the second node is connected) is selected from the first and second nodes, whereby the each individual unit is parallel connected to the resister section provided in the one-order higher unit and set to the impedance value 2Z. For a configuration wherein the number of bit units is x, x−1 hierarchy connector switch sections may preferably be provided.

Figure 10:
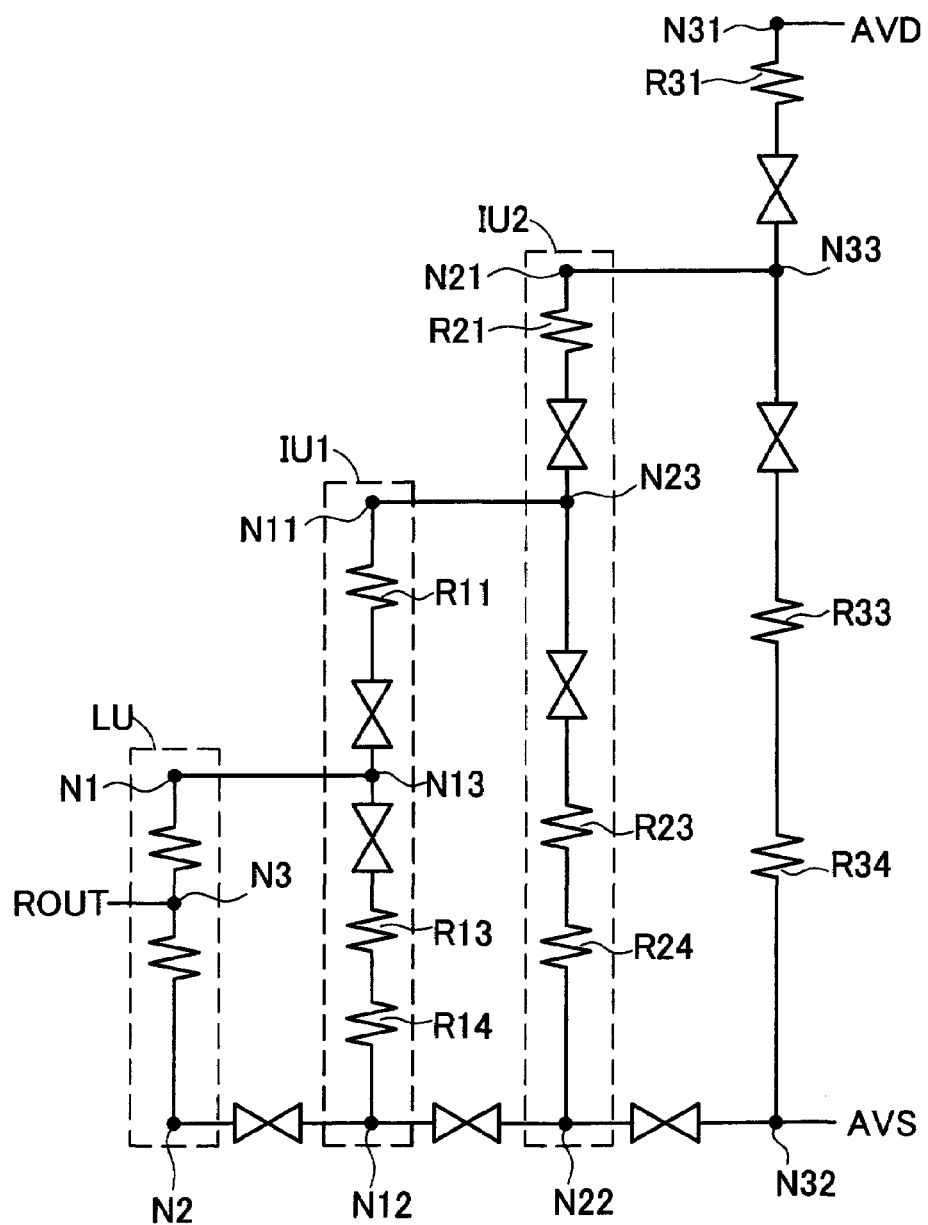
FIG. 10 shows an equivalent circuit of the digital-analog converter circuit 1.

FIG. 10 shows an equivalent circuit of the digital-analog converter circuit 1, which contains the bit units interconnected as described above. The individual resistors have the same impedance value Z. All switches are placed into the conductive state. A hierarchical structure is built in the manner that the each individual unit is parallel connected to the one-order higher resister section set to the impedance value 2Z. Calculation is carried out to obtain a combined impedance from low order unit in the order of the lowest-order bit unit LU, middle-order bit unit IU1, middle-order bit unit IU2, and highest-order bit unit MU. As a result, the value of the combined impedance between the high-level reference voltage AVD and the low-level reference voltage AVS is found to be the impedance value 2Z. The voltage values of the first nodes N21, N11, N1 and the middle node N3 are, respectively, set to the values acquired by dividing the differential voltage between the high-level reference voltage AVD and the low-level reference voltage AVS into the ½, ¼, ⅛, and 1/16 voltage values. Then, in correspondence to the high-level first order bit signal D0, the voltage value (divided 1/16 voltage value) of the middle node N3 of the lowest-order bit unit LU is selected as being an analog signal voltage AV and then output to the analog-signal output terminal ROUT. Thereby, the digital-analog conversion operation is performed corresponding to the output code 1 of the digital data.

FIG. 11 is a table showing the relations between output code settings of the four-bit digital signals D3, D2, D1, and D0, those are output to the digital-analog converter circuit 1 (FIG. 9) and controlled states of the individual switches. According to the switch control operations shown in the table of FIG. 11, the individual bit units are interconnected to correspond to the input output codes whereby to form the hierarchical structures. This consequently enables digital-analog conversion operations corresponding to the individual output codes. Particular operations corresponding to the individual output codes are similar to that in the above-described case of the output code 1, so that descriptions thereof are omitted herefrom.

With reference to FIG. 12, the following will describe a case where the bit number (number of bits) of the digital signal is incremented up to (n−1) (bits) in the digital-analog converter circuit 1. Middle-order bit units interposed between the lowest-order bit unit LU and the highest-order bit unit MU each have the same structure. Similarly, middle-order bit decoders interposed between the lowest-order bit decoder LD and the highest-order bit decoder MD each have the same structure. As such, the bit number can be implemented by inserting middle-order bit units and middle-order bit decoders in individual pairs in correspondence to the bit number being incremented. Accordingly, as is shown in FIG. 12, middle-order bit units IU1 to IU(n−3) are provided for incrementation in a middle-order bit unit area IUA, and middle-order bit decoders ID1 to ID(n−2) are provided for incrementation in a middle-order bit decoder area IDA. This arrangement enables a digital-analog converter circuit corresponding to an n-bit digital signal to be configured.

Referring first to FIGS. 13 to 18, a second embodiment of the invention will be described. FIG. 13 shows a digital-analog converter circuit 1a for four-bit digital data in accordance with the second embodiment. The digital-analog converter circuit 1a has a corrector circuit 4 between a converter section 2a and a decoder section 3a. The corrector circuit 4 is one example of a third corrector section. The converter section 2a is provided with a lowest-order bit unit LU, a middle-order bit unit IU1a, a middle-order bit unit IU2a, a highest-order bit unit MUa, and hierarchy connector switch sections NS1 to NS3. The decoder section 3a is configured similar to the decoder section 3 of the first embodiment (shown in FIG. 9). In addition, other structures have configurations similar to those of the digital-analog converter circuit 1 shown in FIG. 9, so that descriptions thereof are omitted herefrom.

The configuration of the highest-order bit unit MUa will be described here. In a first node resistor section NR31a, a third correction switch DSW31 is series connected to the bypass switch SW33. A second correction switch DSW34 and third correction switches DSW32 and DSW33 are series connected between the second resistor R32 and the first correction switch SW36. In a second node resistor section NR32a, a second correction switch DSW37 and third correction switches DSW35 and DSW36 are series connected between the second resistor R33 and the first correction switch SW32, and a third correction switch DSW38 is series connected to the bypass-switching switch SW35. A first node N31a is connected to the high-level reference voltage AVD, and a second node N32a is connected to the low-level reference voltage AVS. In FIG. 13, individual switch symbols in obliquely hatched portions indicate the second correction switches, individual black switch symbols indicate the third correction switches, and individual void (white) switch symbols indicate the first correction switches.

The configuration of the middle-order bit unit IU2a will be described here. A second node resistor section NR22a has the following configuration. A second correction switch DSW26 and a third correction switch DSW25 are series connected between a second resistor R23 and a first correction switch SW22, and no correction switch is connected to the bypass-switching switch SW25. A first node resistor section NR21a has a configuration similar to the first node resistor section NR31a provided in the highest-order bit unit MUa, so that a description thereof is omitted herefrom. A first node N21a of the middle-order bit unit IU1a middle-order bit unit IU2a is connected to a middle node N33a of the highest-order bit unit MUa. A second node N22a is connected to a node N24 of the hierarchy connector switch section NS3.

The lowest-order bit unit LU has a configuration including nodes N1, N2, and N4 to N6, resistors R1 and R2, second correction switches DSW2 and DSW3, and a third correction switch DSW1. The nodes N2, N5, N4, and N6 are connected to switches OSW1 to OSW4, respectively.

A configuration of the corrector circuit 4 will be described hereunder. The corrector circuit 4 has a first-node connecting fourth correction switch SW111, high-level-reference-voltage connecting fourth correction switches SW121 and SW122, and low-level-reference-voltage connecting fourth correction switches SW131 and SW132, and a correction decoder CD. The high-level-reference-voltage connecting fourth correction switches SW121 and SW122 connect the second node N2 of the lowest-order bit unit LU and a second node N12a of the middle-order bit unit IU1a to the high-level reference voltage AVD. The low-level-reference-voltage connecting fourth correction switches SW131 and SW132 connects the second node N2 of the lowest-order bit unit LU and the second node N12a of the middle-order bit unit IU1a to the low-level reference voltage AVS.

The following will describe effects of the second correction switches. Firstly, for comparison, the combined impedance in the configuration without the second correction switches being inserted will be described hereunder with reference to FIG. 9 (first embodiment). The configuration will be described taking into account ON resistances of the individual switches. In the first node resistor section NR31 of the highest-order bit unit MU, one resistor plus one switch (R31 and SW33) are present in a path routed through the bypass switch SW33. In addition, two resistors and one switch (R31, R32, and SW36) are present in the path routed through the first correction switch SW36. However, in comparison to the path with the one resistor plus one switch, the impedance value of the path with the two resistors plus one switch is not accurately twice because the switch's ON resistance is taken into account whereby to reduce the impedance value by the impedance value of one switch. More specifically, because of the bypass switch SW33, an impedance value unbalance occurs within the first node resistor section NR31. In addition, similar impedance value unbalances occur in other resister sections. As such, in the digital-analog converter circuit 1, the combined impedance is not balanced in the hierarchical structure, and hence the combined impedance value between the high-level reference voltage AVD and the low-level reference voltage AVS becomes variable when the inter-unit connection is switched corresponding to the output-code set value, thereby likely leading to a detrimental case where the consumptive current is inconstant.

In comparison, a configuration with the second correction switches being inserted will be described hereunder with reference to FIG. 13. A pair of the first correction switches and the second correction switched are one example of a first corrector section. In the first node resistor section NR31 of the highest-order bit unit MUa, the second correction switch DSW34 is inserted between the first correction switch SW36 and the second resistor R32 to be connected to parallel connected to the bypass switch SW33. The third correction switches are described below, so that the third correction switches DSW32 and DSW33 are now neglected. In this configuration, two resistors plus two switches (the first resistor R31, the second resistor R32, the second correction switch DSW34, and the first correction switch SW36) are present in a path routed through the first correction switch SW36 of the first node resistor section NR31a. Similarly, in a state where the third corrector switch DSW31 is neglected, one resistor plus one switch (the first resistor R31 and the bypass switch SW33) are present in the path routed through the bypass switch SW33. In this state, the impedance value of the path with the two resistors plus two switches is accurately twice in comparison to the path with the one resistor plus one switch. Consequently, such an event of the unbalanced combined impedance value in the hierarchical structure can be prevented. More specifically, the insertion of the first and second correction switches SW36 and DSW34 (first corrector section) enables correcting the impedance value unbalance in the first node resistor section NR31a associated with the bypass switch SW33.

Effects of the third correction switches will be described below. The third correction switches are one example of a second corrector section. Firstly, for comparison, a combined impedance in a configuration where no third correction switches are inserted will be described here with reference to FIG. 9 (first embodiment). The configuration will now be described taking ON resistance of the respective switch into account. Discussion is now directed to a path routed through the bypass-switching switch in the middle-order bit unit IU2. The one resistor plus one switch (SW23 and R21) are present in the path routed from the middle node 23 to the first node N21 through the bypass-switching switch SW23 and the first resistor R21. However, the connector switch SW21 of the hierarchy connector switch section NS3 is present in the path routed from the middle node N23 of the middle-order bit unit IU2 to the second node N32 of the highest-order bit unit MU through the bypass-switching switch SW25, the first resistor R24, the second node N22, and the hierarchy connector switch section NS3. That is, the one resistor plus two switches (SW25, R24, and SW21) are present in the above-described path. Thus, while either of the paths is routed through the bypass-switching switch, there occur two cases. One of the cases is that the ratio between the numbers of resistors to the total number of the switches is 1:1, and the other case is that the ratio is 1:2. In such the configuration, although the hierarchy connector switch section NS3 is not present in the path routed from first node N21 to the highest-order bit unit MU, an unbalance occurs since the hierarchy connector switch section NS3 is present in the path routed from the second node N22 to the highest-order bit unit MU. That is, an impedance value unbalance occurs in association with the connector switch SW21. The unbalance in impedance value causes the event that the combined impedance in the hierarchical structure is not balanced. Consequently, an event occurs in which the combined impedance value between the high-level reference voltage AVD and the low-level reference voltage AVS becomes variable corresponding to the output-code set value variations, thereby causing the consumptive current to be inconstant.

For comparison, the configuration with the third correction switches being inserted will be described with reference to FIG. 13. Referring to FIG. 13, one resistor plus two switches (SW23, DSW21, and R21) are present in a path routed from a middle node N23a to the first node N21a through the bypass-switching switch SW23, third correction switch DSW21, and first resistor R21 of the first node resistor section NR21a. In addition, one resistor plus two switches (SW25, R24, and SW21) are present in a path routed from the middle node N23a to the second node N32a of the highest-order bit unit MUa through the bypass-switching switch SW25, first resistor R24, second node N22a, and hierarchy connector switch section NS3 of the second node resistor section NR22a. Thus, the numbers of resistors and switches in the path routed through the bypass-switching switch are unified to be the one resistor plus two switches in the first node resistor section NR21a and the second node resistor section NR22a.

In a similar manner, the number of resistors and switches in the path routed through the first correction switch is unified. Specifically, two resistors plus four switches (SW26, DSW24, DSW23 and DSW22 (third correction switches), R22, and R21) are present in a path routed from the middle node N23a to the first node N21a through first correction switch SW26 of the first node resistor section NR21a. In addition, two resistors plus four switches (SW22, DSW26, DSW25 (third correction switch), R23, R24, and SW21) from the middle node N23a to the second node N32a of the highest-order bit unit MU through the first correction switch SW22 of the second node resistor section NR22a. Thus, the number of resistors and switches in the path routed through the first correction switch is unified to be the two resistors plus four switches. Thereby, in comparison to the path with the one resistor plus two switches, the impedance value of the path with the two resistors plus four switches is accurately twice when ON resistances of the individual switches are taken into account. Consequently, such an event of the unbalanced combined impedance value in the hierarchical structure can be prevented. More specifically, the insertion of the third correction switches (second corrector section) enables correcting an inter-unit unbalanced impedance value that could occur in association with the hierarchy connector switch section.

Accordingly, even when the inter-unit connection is switched to perform the digital-analog conversion operation corresponding to the output-code set value, the combined impedance value between the high-level reference voltage AVD and the low-level reference voltage AVS can be maintained constant. As such, no fluctuations occur in the consumptive current between the high-level reference voltage AVD and the low-level reference voltage AVS, and hence the reference voltages do not fluctuate upon being influenced by consumptive current fluctuations. Consequently, an accurate analog signal voltage AV can be acquired.

The ratio (1:2) in the numbers of the resistors and the switches shown in FIG. 13 is a lowest ratio necessary to correct impedance value unbalances associated with the bypass-switching switch sections and the hierarchy switch sections. The 1:2 ratio is preferably used to minimize the circuit size. The ratio is preferable for the reason that two switches, one for bypass operation and the other for selecting the opponent connection point, are mandatory for the path routed from the middle node N23a of the middle-order bit unit IU2a through the bypass-switching switch SW25 and the hierarchy connector switch section NS3. That is, a combinatorial set of one resistor plus two switches (SW25, R24, SW21, or SW24) is mandatory for the path, whereby the ratio between the numbers of the resistors and the switches is set to 1:2.

Figure 14:
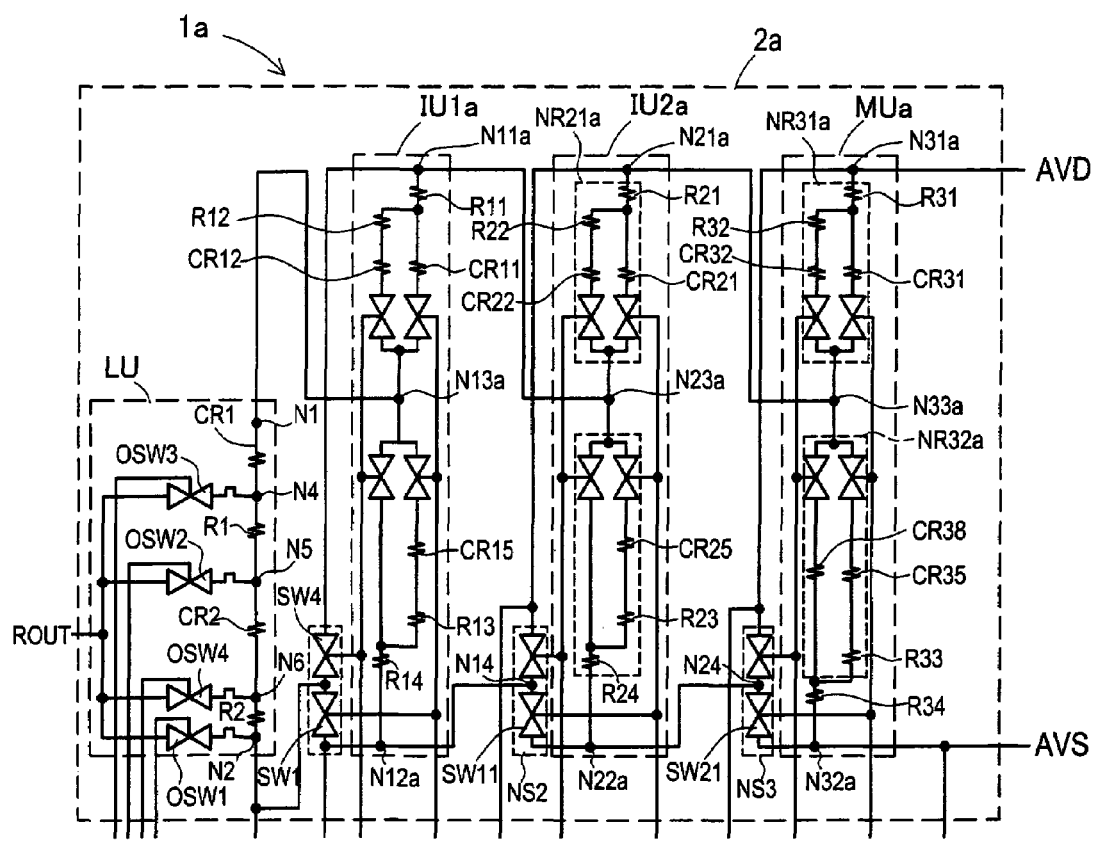
FIG. 14 is a diagram in case correction resistors are inserted.

As described above, the present embodiment has the configuration employing the mode of inserting the second and third correction switches to correct the impedance value unbalance, but the configuration is not limited thereto. For example, as is shown in FIG. 14, in lieu of the second and third correction switches provided in the converter section 2a, a correction resistor having the same impedance value may be provided. More specifically, the first node resistor section NR31a of the highest-order bit unit MUa may be configured to include a correction resistor CR31 having the same impedance value as that of the third corrector switch DSW31, and a correction resistor CR32 having the same impedance value as the combined impedance value of the impedance values of the third correction switches DSW32 and DSW33 and the second correction switch DSW34. Similarly, the second node resistor section NR32a may be configured to include a correction resistor CR38 having the same impedance value as that of the third correction switch DSW38, and a correction resistor CR35 having the same impedance value as the combined impedance value of the impedance values of the third correction switches DSW35 and DSW36 and the second correction switch DSW37. Similarly, the middle-order bit unit IU2a may be configured to include correction resistors CR21, CR22, and CR25; the middle-order bit unit IU1a may be configured to include correction resistors CR11, CR12, and CR15; and the lowest-order bit unit LU may be configured to include correction resistors CR1 and CR2. Any of these configurations capable of correcting the impedance value unbalance associated with the bypass-switching switch and the hierarchy connector switch section.

Figure 15:
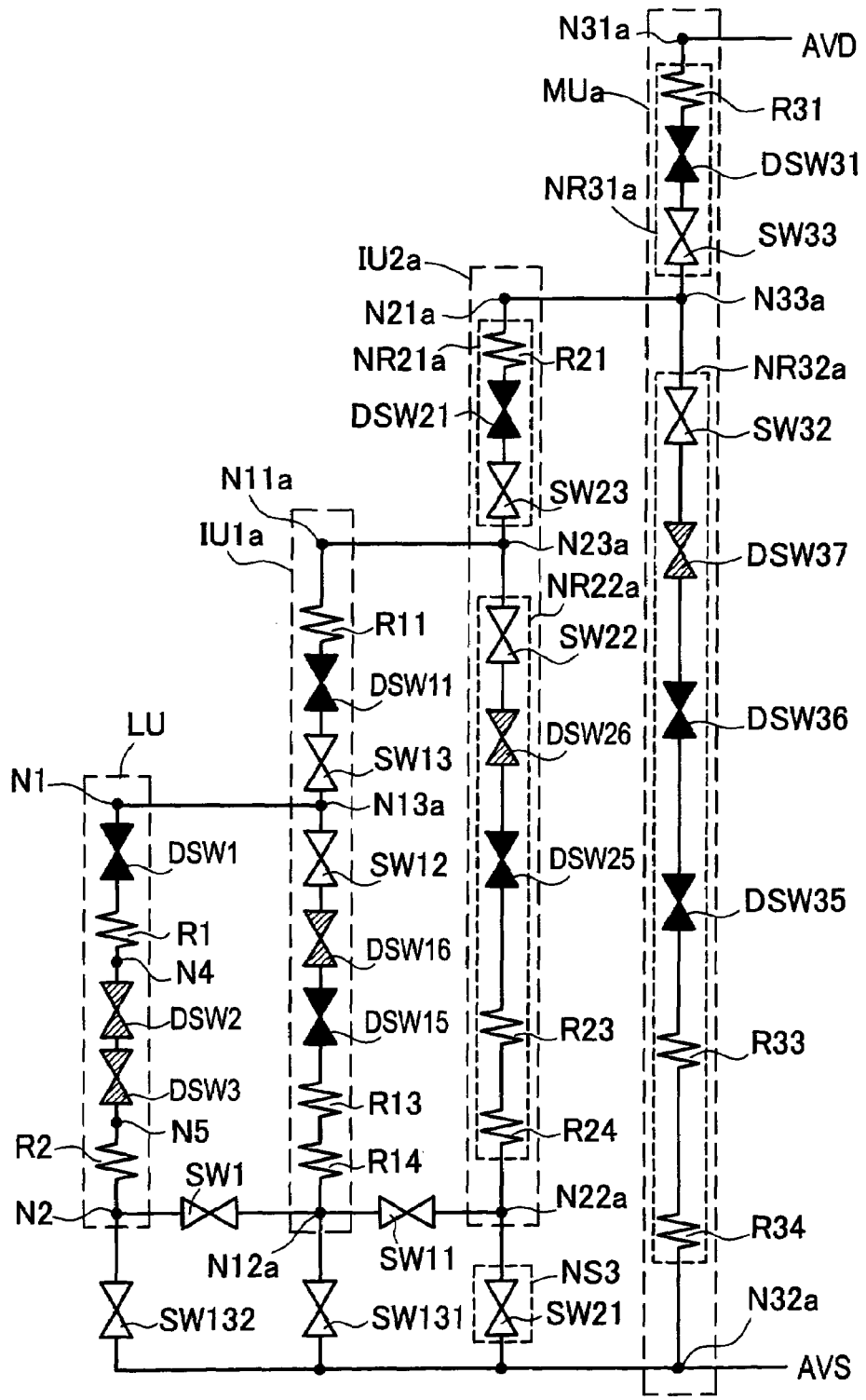
FIG. 15 shows an equivalent circuit in case output code 1 is inputted.

A correction operation with each individual correction switch of the corrector circuit 4 will be described here. The corrector circuit 4 is an example of a third corrector section. Description will be given with reference to an example case where respective digital signals D3, D2, D1, and D0 at "L, L, L, H (high)" levels (output code 1) are input. FIG. 15 shows an equivalent circuit depicting inter-unit connection in the circuit shown in FIG. 13 in the event of the output code 1. In FIG. 15, individual switch symbols in obliquely hatched portions indicate the second correction switches, individual black switch symbols indicate the third correction switches, and individual void (white) switch symbols indicate the first correction switches.

Operations of the low-level-reference-voltage connecting fourth correction switches SW131 and SW132 (each of which hereafter will be referred to as "fourth correction switch" unless it should be specifically identified) will be described hereunder. Firstly, for comparison, the following will describe a configuration not using the fourth correction switches SW131 and SW132. Referring to FIG. 15, a case will be described where a combined impedance of the impedances of the lowest-order bit unit LU and the middle-order bit unit IU1a is calculated. Discussion is directed to the configuration where the fourth correction switches SW131 and SW132 are nonconductive. Discussion is now directed to the case where calculation is carried out to obtain a combined impedance of components in the path from a middle node N13a to the second node N12a in the middle-order bit unit IU1a. In the configuration, two resistors plus four switches are present in the path routed from the node N1 of the lowest-order bit unit LU to the second node N12a through the node N2. In the middle-order bit unit IU1a, two resistors plus three switches are present in the path routed from the middle node N13a to the second node N12a. As such, the ratio between the numbers of the resistors and the switches in the two paths does not match the predetermined 1:2 described above. This state occurs for the reason that as in the manner that the second node N2 of the lower-order unit thereof, namely, the lowest-order bit unit LU, is connected to the second node N12a of the middle-order bit unit IU1a, in the configuration where the second nodes are continually interconnected, the connector switch SW11 of the hierarchy connector switch sections NS2 is not present in the path (from the middle node N13a to the second node N12a in the middle-order bit unit IU1a) to which the lower-order unit is connected. Consequently, the path enters the state where one switch is short in the number of switches.

Similarly, discussion is directed to the case where calculation is carried out to obtain a combined impedance of the impedances in the path from middle node N23a to the second node N22a. Also in this configuration, the connector switch SW21 of the hierarchy connector switch section NS3 is not parallel connected to the path routed from the first node N11a of the middle-order bit unit IU1a to the second node N22a through the second node N12a. Consequently, the two resistors plus three switches are present in the path from the middle node N23a to the second node N22a. In this case, however, the ratio between the numbers of the resistors and the switches does not match the predetermined 1:2 switch ratio described above. Similar to the above, this state occurs for the reason that as in the manner that the second node N12a of the lower-order unit thereof, namely, the middle-order bit unit IU1a, is connected to the second node N22a of the middle-order bit unit IU2a, in the configuration where the second nodes are continually interconnected, the connector switch SW21 of the hierarchy connector switch sections NS3 is not present in the path (from the middle node N23a to the second node N22a in the middle-order bit unit IU2a) to which the lower-order unit is connected. Consequently, the path enters the state where one switch is short in the number of switches.

The following will describe effects of the configuration using the low-level-reference-voltage connecting forth correction switches SW131 and SW132. With reference to FIG. 15, discussion is directed to the configuration where the fourth correction switches SW131 and SW132 are driven conductive. In this state, the second nodes N2, N12a, and N22a are all at a same potential, so that no current flows between them. As such, the presence of the switches SW1 and SW11 is negligible, whereby to enable assuming that the opponent connection point of the second node N2 has been changed from the second node N12a to the low-level reference voltage AVS. Concurrently, the opponent connection point of the second node N12a can be assumed to have been changed from the second node 22a to the low-level reference voltage AVS.

Discussion is now directed to the case where calculation is carried out to obtain a combined impedance in the above-described configuration. In this configuration, in the lowest-order bit unit LU, two resistors plus four switches (DSW1 to DSW3, R1, R2, and SW132 (fourth correction switch)) are present in the path with the second nodes N1 and N2 and the low-level reference voltage AVS. Concurrently, in the middle-order bit unit IU1a, two resistors plus four switches (SW12, DSW16, DSW15, R13, R14, and SW131 (fourth correction switch)) are present also in the path routed from the middle node N13a to the low-level reference voltage AVS through the second node N12a. Further, in the middle-order bit unit IU2a, two resistors plus four switches (SW22, DSW26, DSW25, R23, R24, and SW21 (connector switch)) are present also in the path routed from the middle node N23a to the low-level reference voltage AVS through the second node N22a. Thus, in all the above-described paths, the predetermined 1:2 switch ratio described above is conformably applied. Consequently, the combined impedance value between the high-level reference voltage AVD and the low-level reference voltage AVS is maintained constant.

As such, in the digital-analog conversion, no fluctuations occur in the consumptive current between the high-level reference voltage AVD and the low-level reference voltage AVS, and hence the reference voltages do not fluctuate upon being influenced by consumptive current fluctuations. Consequently, an accurate analog signal voltage AV can be acquired.

The above-described operation of the low-level-reference-voltage connecting fourth correction switch is generalized and will be described here. In a configuration where second nodes of lower-order units are continually connected across "a" pieces of units to a second node (connected to the low-level reference voltage AVS) of an x-th order unit serving as a highest-order unit, opponent connection points of all the second nodes of an (x−a)th order unit to an (x−2)th order unit are switched by the low-level-reference-voltage connecting fourth correction switches to the low-level reference voltage AVS.

Operations of the high-level-reference-voltage connecting fourth correction switches will be described hereunder. The fourth correction switches are used in the case where the individual second nodes N2, N12a, and N22a are all connected to the high-level reference voltage AVD through the hierarchy connector switch sections NS1 to NS3. Particular operation is similar to the low-level-reference-voltage connecting fourth correction switches, so that a detailed description thereof is omitted herefrom. The operation of the high-level-reference-voltage connecting fourth correction switches SW122 and SW122 is generalized and will be described here. In a configuration where second nodes of lower-order units are continually connected across "a" pieces of units to a second node (connected to the high-level reference voltage AVD) of an x-th order unit serving as a highest-order unit, opponent connection points of all the second nodes of an (x−a)th order unit to an (x−2)th order unit are switched by the high-level-reference-voltage connecting fourth correction switches to the high-level reference voltage AVD.

Figure 16:
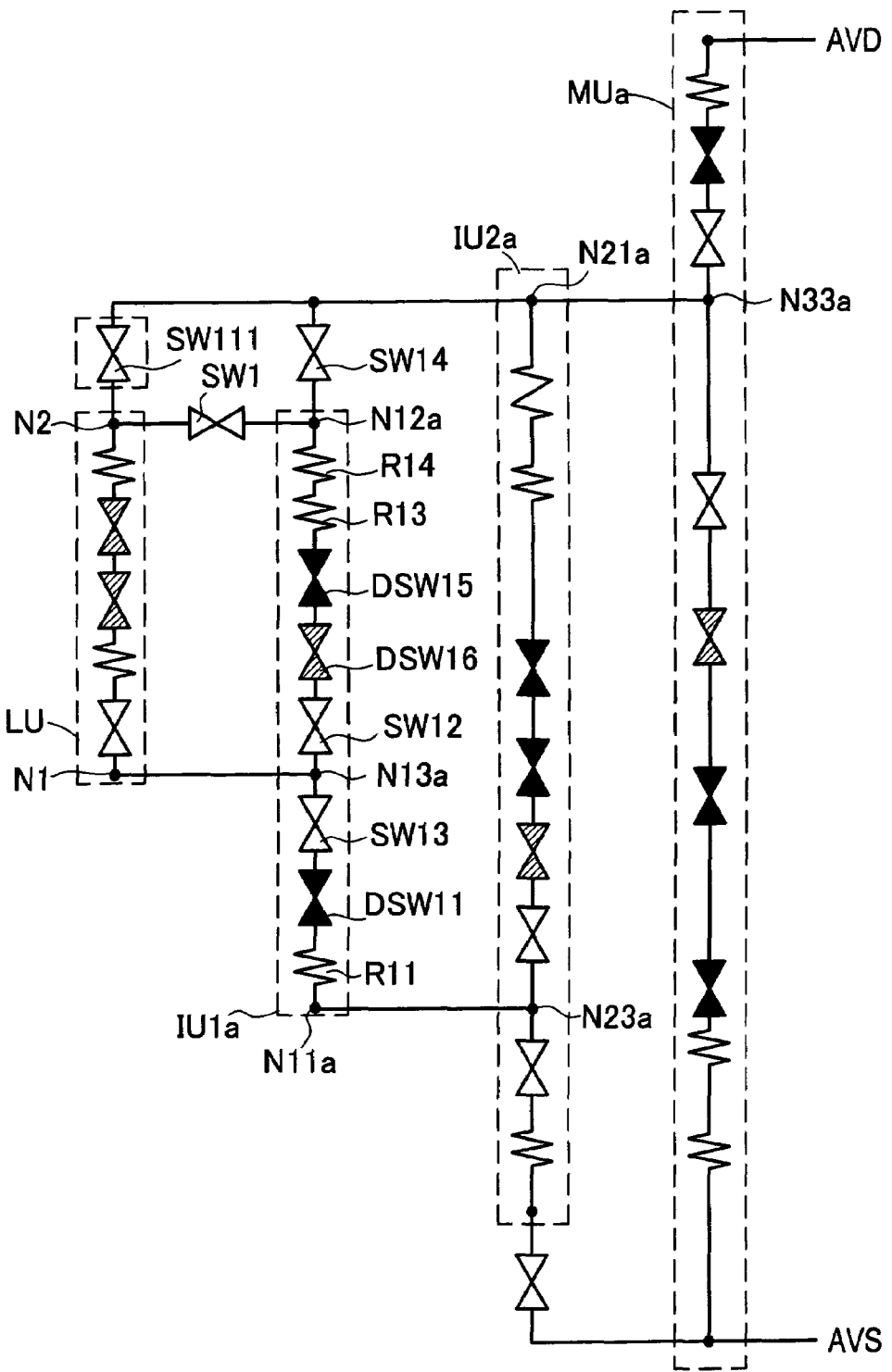
FIG. 16 shows an equivalent circuit in case output code 6 is inputted.
Figure 21:
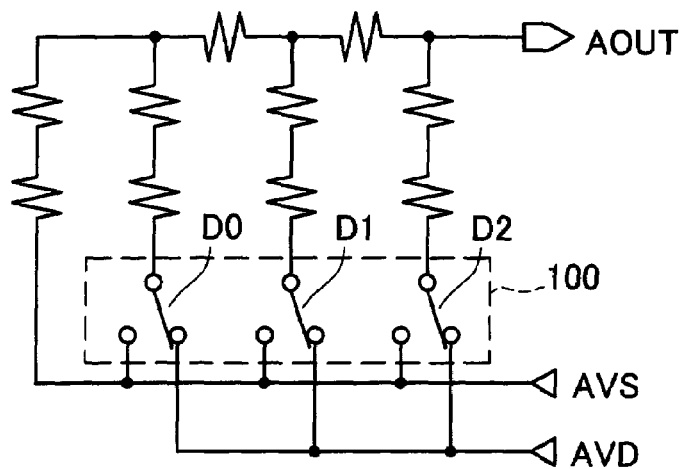
FIG. 21 is a diagram of conventional three-bit digital-analog converter.

The operation of the first-node connecting fourth correction switch SW111 will be described hereunder. By way of example, the following will describe the operation of the fourth correction switch SW111 in the case where digital signals D3, D2, D1, and D0 at "L, H, H, L" levels (output code 6) are input. FIG. 16 shows an equivalent circuit depicting inter-unit connection in the circuit shown in FIG. 13 in the event of the output code 6. As is shown in FIG. 16, the fourth correction switch SW111 is used when the two nodes, namely the second node N2 of the lowest-order bit unit LU and the second node N12a of the middle-order bit unit IU1a, are connected to the first node N21a of the middle-order bit unit IU2a.

The following will describe effects of the fourth correction switch SW111. Firstly, referring to FIG. 16, description will be given to the case of the nonconductive state where the fourth correction switch SW111 is not used. Discussion is now directed to the case where a combined impedance of the impedances of the lowest-order bit unit LU and the middle-order bit unit IU1a is calculated. In the state where the second node of the lowest-order bit unit LU is connected to the second node N12a of the middle-order bit unit IU1a through the connector switch SW1, the connector switch SW14 is not parallel connected to the lowest-order bit unit LU. In this case, in the lowest-order bit unit LU, two resistors plus four switches are present in the path with the nodes N1, N2, and N12a. However, in the middle-order bit unit IU1a, two resistors plus three switches are present in the path from the middle node N13a to the second node N12a to which the lowest-order bit unit LU is parallel connected. Accordingly, the predetermined 1:2 switch ratio described above is not satisfied. More specifically, when the second nodes N2 and N12a are continually interconnected, the connector switch SW14 of the hierarchy connector switch sections NS2 is not reckoned in the calculation of the combined impedance in the path from the middle node N13a to the second node N12a in the middle-order bit unit IU1a.

The following will now describe the conductive state where the fourth correction switch SW111 is used. In this state, the second nodes N2 and N12a are at a same potential, so that no current flows between them. As such, the presence of the switches SW1 is negligible. Accordingly, the opponent connection point of the second node N2 can be assumed to have been changed to the first node N21a of the middle-order bit unit IU2a from the second node N12a of the middle-order bit unit IU1a. When a combined impedance in this case is calculated, two resistors plus four switches are found to be present in the path with the nodes N1, N2, and 21a in the lowest-order bit unit LU. Concurrently, also in middle-order bit unit IU1a, two resistors plus four switches are present in the path (from the middle node N13a to the first node N21a) to which the lowest-order bit unit LU is connected, whereby the predetermined 1:2 switch ratio described above is conformably applied. Thus, the predetermined 1:2 switch ratio is conformably applied in all the paths, so that the combined impedance value between the high-level reference voltage AVD and the low-level reference voltage AVS is maintained constant. As such, in the digital-analog conversion, no fluctuations occur in the consumptive current between the high-level reference voltage AVD and the low-level reference voltage AVS, and hence the reference voltages do not fluctuate upon being influenced by consumptive current fluctuations. Consequently, an accurate analog signal voltage AV can be acquired.

The above-described configuration of the first-node connecting fourth correction switch is generalized and will be described here. In a configuration where second nodes of lower-order units are continually connected across "a" pieces of units to a first node of a k-th order unit (k=value greater or equal to 3 and less than or equal to (x−1)), opponent connection points of all the second nodes of a (k−a)th order unit to a (k−2)th order unit are switched by the fourth correction switch SW111 to the first node of the k-th order unit.

As described above, as shown in the digital-analog converter circuit 1a of FIG. 13, an impedance corrector section is configured of the first to fourth correction switches, whereby to enable correcting impedance value unbalances associated with the bypass-switching switches and the hierarchy connector switch sections.

FIG. 17 is a table showing relations between output code settings of the four-bit digital signals D3, D2, D2, D1, and D0 to be input to the digital-analog converter circuit 1a and controlled states of individual switches of the digital-analog converter circuit 1a. In accordance with the switch control operations performed as shown in FIG. 17, the individual units are interconnected and the hierarchical structure is configured, whereby to enable digital-analog conversion operations corresponding to the individual output codes. Particular operations corresponding to the each individual output code are similar to those in the above-described event of the output code 1, so that descriptions thereof are omitted herefrom.

The following will describe a case where the bit number of the digital signal is incremented by one (bit) in the digital-analog converter circuit 1a shown in FIG. 18. A middle-order bit unit IU3a is inserted between the highest-order bit unit MUa and the middle-order bit unit IU2a, and a middle-order bit decoder ID3 is inserted between the highest-order bit decoder MD and the middle-order bit decoder ID2. Further, one low-level-reference-voltage connecting fourth correction switch is added to a low-level-reference-voltage connecting fourth correction switch area LSW so that all the second nodes of the lowest-order bit unit LU to the middle-order bit unit IU2a are connected to the low-level reference voltage AVS. Similarly, one high-level-reference-voltage connecting fourth correction switch is added to a high-level-reference-voltage connecting fourth correction switch area HSW so that all the second nodes of the lowest-order bit unit LU to the middle-order bit unit IU2a are connected to the high-level reference voltage AVD. In addition, a first-node connecting fourth correction switch 112a and a first-node connecting fourth correction switch 113a is connected to a first-node connecting fourth correction switch area CSW. The fourth correction switch 112a is used to connect the first node of the middle-order bit unit IU1a to the first node of the middle-order bit unit IU3a, and fourth correction switch 113a is used to connect the first node of the lowest-order bit unit LU to the first node of the middle-order bit unit IU3a. Further, correction decoder sections CDa are configured corresponding to the low-level-reference-voltage connecting fourth correction switch, high-level-reference-voltage connecting fourth correction switch, and first-node connecting fourth correction switches. Thereby, a digital-analog converter circuit corresponding to a five-bit digital signals can be configured.

Referring to FIG. 19, a third embodiment of the invention will now be described hereunder. The third embodiment relates to a digital-analog converter circuit 1b formed by devising the circuit configurations to further improve the accuracy. The highest-order bit unit MUb has a first node resistor section NR31b and a second node resistor section NR32b. The first node resistor section NR31b and the second node resistor section NR32b each have a configuration in which two resistors each having the impedance value Z are series connected. In accordance with a connection method similar to that described with reference to FIG. 9, a middle-order bit unit IU2U and IU1U, a lowest-order bit unit LUU, and hierarchy connector switch sections NS2U and NS1U are connected to the first node resistor section NR31b. Similarly, a middle-order bit unit IU2D and IU1D, a lowest-order bit unit LUD, and hierarchy connector switch sections NS2D and NS1D are connected to the second node resistor section NR32b. An output terminal of the lowest-order bit unit LUU is connected to an analog-signal output terminal ROUT through a switch OSW5 of an output selector section OP. An output terminal of the lowest-order bit unit LUD is connected to the analog-signal output terminal ROUT through a switch OSW6 of the output selector section OP. A fourth order bit signal D3 is input to the switch OSW5 of the output selector section OP, and a fourth order bit signal D3 reversed by an inverter is input to the switch OSW6 of the output selector section OP. Meanwhile, the highest-order bit unit MUb is an example of a parallel highest-order unit.

Operation of the digital-analog converter circuit 1b shown in FIG. 19 will be described hereunder. Identical numbers of lower-order units that each have the same structure and perform the same operation are parallel connected to the first node resistor section NR31b and the second node resistor section NR32b. Accordingly, the combined impedance value of the lower-order units in the first node resistor section NR31b and the combined impedance value of the lower-order units in the second node resistor section NR32b are each set to the impedance value Z. When a high-level fourth order bit signal D3 is input to the output selector section OP, the switch OSW5 becomes nonconductive, and the switch OSW6 becomes conductive, whereby an output of the lowest-order bit unit LUU is output from the analog-signal output terminal ROUT. On the other hand, when a low-level fourth order bit signal D3 is input to the output selector section OP, the switch OSW5 becomes conductive, and switch OSW6 becomes nonconductive, whereby an output of the lowest-order bit unit LUD is output from the analog-signal output terminal ROUT.

Effects of the circuit configuration will be described hereunder. In the configuration shown in FIG. 19, the first node resistor section NR31b to which the lower-order units are parallel connected is connected between the high-level reference voltage AVD and a middle node N33b. Similarly, the second node resistor section NR32b to which the lower-order units are parallel connected is connected between the low-level reference voltage AVS and the middle node N33b. That is, a circuit configuration symmetric on the high-level reference voltage AVD side and the low-level reference voltage AVS side with respect to the middle node N33b in the center. Accordingly, even when fluctuations have occurred in resistance values of various devices, fluctuations can be prevented from occurring between the high-level reference voltage AVD and the middle node N33b and between the low-level reference voltage AVS and the middle node N33b. Thereby, the differential voltage between the high-level reference voltage AVD and the low-level reference voltage AVS can be accurately divided into ½-voltage values. Consequently, a digital-analog converter circuit can be configured that minimizes the influence of fluctuations in the impedance values of devices such as resistors and switches and that performs digital-analog conversion operation with even higher accuracy.

Referring to FIG. 20, a fourth embodiment of the invention will now be described hereunder. The fourth embodiment relates to a digital-analog converter circuit 1c formed by devising the circuit configurations to further improve the accuracy. The digital-analog converter circuit 1c is a circuit in which a converter section 2e in addition to the converter section 2 shown in FIG. 9. In accordance with a connection method similar to that described with reference to FIG. 9, a middle-order bit units IU2e and IU1e, and a lowest-order bit unit LUe are connected to a highest-order bit unit MUe through hierarchy connector switch sections NS3e, NS2e, and NS1e. The high-level reference voltage AVD and the low-level reference voltage AVS are connected to the highest-order bit unit MUe through reversed connection with respect to the connection to the highest-order bit unit MU. Further, the middle node N33 of the highest-order bit unit MU and a middle node N33e of the highest-order bit unit MUe are connected to the circuit. An output terminal of the lowest-order bit unit LUe is connected to an analog reverse signal output terminal ROUT INV.

A first node resistor section NR31 and a second node resistor section NR32e are parallel connected between the middle node N33, N33e and the high-level reference voltage AVD. A second node resistor section NR32 and a first node resistor section NR31e are connected between the middle node N33, N33e and the low-level reference voltage AVS. When the fourth order bit signal D3 is high level, the first node resistor section NR31 to which the lower-order unit is parallel connected and the second node resistor section NR32e to which the lower-order unit is not parallel connected are connected parallel to each other between the middle node N33, N33e and the high-level reference voltage AVD. On the other hand, when the fourth order bit signal D3 is low level, the first node resistor section NR31 to which the lower-order unit is not parallel connected and the second node resistor section NR32e to which the lower-order unit is parallel connected are connected parallel to each other between the middle node N33, N33e and the high-level reference voltage AVD. Thus, in any of the events of high and low levels of the fourth order bit signal D3, the resister section to which the lower-order unit is parallel connected and the resister section to which the lower-order unit is not parallel connected are parallel connected at all times between the middle node N33, N33e and the high-level reference voltage AVD. Similarly, in any of the events of high and low levels of the fourth order bit signal D3, the resister section to which the lower-order unit is parallel connected and the resister section to which the lower-order unit is not parallel connected and set to the impedance value Z are parallel connected at all times between the middle node N33 and the low-level reference voltage AVS. Thus, in any of the events of high and low levels of the fourth order bit signal D3, there are provided the circuit configurations symmetric on the high-level reference voltage AVD side and the low-level reference voltage AVS side with respect to the middle node N33 in the center. Thereby, the differential voltage between the high-level reference voltage AVD and the low-level reference voltage AVS can be accurately divided into ½-voltage values. Consequently, a digital-analog converter circuit can be configured that minimizes the influence of fluctuations in the impedance values of devices such as resistors and switches and that performs digital-analog conversion operation with even higher accuracy.

The present invention is not limited to the embodiments, but various modifications and changes may of course be made without departing from the spirit and scope of the invention. The first correction switches and the digital-analog converter circuit using the correction switches according to the second embodiment may of course be used for the digital-analog converter circuit 1b according to the third embodiment and the digital-analog converter circuit 1c according to the fourth embodiment.

The lowest-order bit unit LU, LUU, LUD, LUe, or the like is one example of a first resister section. The first node resistor section NR31, NR31a, NR21, or the like, and second node resistor section NR32, NR32a, NR22, or the like is one example of a second resister section. The impedance value Z is one example of a first impedance value, and the impedance value 2Z is one example of a second impedance value. The low-level reference voltage AVS is one example of a first reference voltage, and the high-level reference voltage AVD is one example of a second reference voltage. The first correction switch and the second correction switch constitute one example of a first corrector section, the third correction switch is one example of a second corrector section, and the corrector circuit 4 is one example of a third corrector section.

According to the digital-analog converter circuit of the present invention, the consumptive current flowing between the first reference voltage and the second reference voltage can be prevented from fluctuating, so that the reference voltages can be prevented from fluctuating upon being influenced by the consumptive current fluctuations, and an accurate analog signal voltage can be acquired. Since reference voltage fluctuations due to the influence of consumptive current variations is restrained, a reference power source having a higher drive capacity need not be provided, therefore enabling preventing increase in the circuit size.

What is claimed is:

1. A digital-analog converter circuit for converting a digital signal of x bits, comprising:
    a first order unit comprising a first resister section and corresponding to a lowest-order bit or a first-order bit signal;
    m-th order units (m=value from 2 to x) each comprising two second resister sections series connected at a middle node and each corresponding to an m-th bit signal, wherein
    when the m-th order bit signal is a first level, an impedance value of the second resister section connected to a first voltage side is set to a first impedance value, and an impedance value of the second resister section connected to a second voltage side is set to a second impedance value that is twice the first impedance value, and
    when the m-th order bit signal is a second level, the impedance value of the second resister section connected to the first voltage side is set to the second impedance value that is twice the first impedance value, and the impedance value of the second resister section connected to the second voltage side is set to the first impedance value; and a hierarchical structure wherein
an (m−1)th order unit is parallel connected to the second resister section of the m-th order unit that has been set to the second impedance value, and
an x-th order unit is connected between the first reference voltage and the second reference voltage.

2. A digital-analog converter circuit according to claim 1, wherein the second resister section comprises:
a first resistor comprising a reference resistor;
a second resistor connected to the first resistor and comprising a reference resistor; and
a bypass-switching switch parallel connected to the second resistor.

3. A digital-analog converter circuit according to claim 1, wherein the second resister sections each comprise:
a first resistor comprising a reference resistor;
a second resistor connected to the first resistor and comprising a reference resistor; and
a bypass-switching switch that bypasses the second resistor.

4. A digital-analog converter circuit according to claim 1, wherein:
an i-th order first node (i=value from 1 to (x−1)) provided at one end of an i-th order unit is connected to an (i+1)th order middle node of an (i+1)th order unit; and
the digital-analog converter circuit further comprises an i-th order hierarchy switch section that connects an i-th order second node provided at an other end of the i-th order unit to an any one of an (i+1)th order first node and an (i+1)th order second node of the (i+1)th order unit.

5. A digital-analog converter circuit according to claim 2, comprising an impedance corrector section that offsets an impedance value unbalance occurring in association with the bypass-switching switch.

6. A digital-analog converter circuit according to claim 2, comprising an impedance corrector section that offsets an impedance value unbalance occurring in association with the i-th order hierarchy switch section.

7. A digital-analog converter circuit according to claim 5, wherein:
the impedance corrector section comprises a first corrector section that is series connected to the second resistor and that is parallel connected to the bypass-switching switch; and
the bypass-switching switch is turned to a nonconductive state when the first corrector section is turned to a conductive state in response to the corresponding bit signal; and the bypass-switching switch is turned to the conductive state when the first corrector section is turned to the nonconductive state in response to the corresponding bit signal.

8. A digital-analog converter circuit according to claim 7, wherein an impedance value in a path comprising the first resistor, the second resistor, and the first corrector section is set to a double value with respect to an impedance value in a path comprising the first resistor and the bypass-switching switch.

9. A digital-analog converter circuit according to claim 8, wherein:
the impedance corrector section comprises a second corrector section;
total values of impedances are individually set to a same value, the total values being
a total value of impedances in a path routed from a j-th order middle node (i=value from 2 to (x−1)) of a j-th order unit to a j-th order first node through the second resistor and the first resistor,
a total value of impedances in a path routed from the j-th order middle node of the j-th order unit through the second resistor, the first resistor, the j-th order second node, and a connector switch of j-th order hierarchy switch section,
a total value of impedances in a path routed from an x-th order middle note of the x-th order unit to a high-level reference voltage through the second resistor and the first resistor,
a total value of impedances in a path routed from the x-th order middle node of the x-th order unit to a low-level reference voltage through the second resistor and the first resistor, and
a total value of impedances in a path routed from a first-order first node of the first order unit through a first-order second node and a connector switch of first-order hierarchy switch section; and
total values of impedances are individually set to a same value, the total values being
a total value of impedances in a path routed from the j-th order middle node of the j-th order unit to the j-th order first node through the bypass-switching switch and the first resistor,
a total value of impedances in a path routed from the j-th order middle node of the j-th order unit through the bypass-switching switch, the first resistor, a j-th order second node, and a connector switch of the j-th order hierarchy switch section,
a total value of impedances in a path routed from the x-th order middle node of the x-th order unit to the high-level reference voltage through the bypass-switching switch and the first resistor, and
a total value of impedances in a path routed from the x-th order middle node of the x-th order unit to the low-level reference voltage through the bypass-switching switch and the first resistor.

10. A digital-analog converter circuit according to claim 8, wherein:
the first corrector section comprises a first correction switch and a second correction switch that each have a same configuration as the bypass-switching switch; and
the second corrector section comprises a third correction switches that have the same configuration as the bypass-switching switch.

11. A digital-analog converter circuit according to claim 10, wherein the second correction switch and the third correction switches are individually correction resistors.

12. A digital-analog converter circuit according to claim 10, wherein:
the impedance corrector section comprises a third corrector switches;
ratios between the numbers of resistors and switches are individually set to a same value, the ratios being a ratio between the numbers of resistors and switches present in a path routed from a j-th order middle node (j=value from 2 to (x−1)) of a j-th order unit to a j-th order first node through the second resistor and the first resistor,
a ratio between the numbers of resistors and switches present in a path routed from the j-th order middle node of the j-th order unit through the second resistor, the first resistor, the j-th order second node, and a connector switch of a j-th order hierarchy switch section,
a ratio between the numbers of resistors and switches present in a path routed from an x-th order middle node of the x-th order unit to a high-level reference voltage through the second resistor and the first resistor, a ratio between the numbers of resistors and switches present in a path routed from the x-th order middle node of the x-th order unit to a low-level reference voltage through the second resistor and the first resistor, and a ratio between the numbers of resistors and switches present in a path routed from a first-order first node of the first order unit through a first-order second node and a connector switch of a first-order hierarchy switch section; and ratios between the numbers of resistors and switches are individually set to a same value, the ratios being a ratio between the numbers of resistors and switches present in a path routed from the j-th order middle node of the j-th order unit (j=value from 2 to (x−1)) to the j-th order first node through the bypass-switching switch and the first resistor, a ratio between the numbers of resistors and switches present in a path routed from the j-th order middle node of the j-th order unit through the bypass-switching switch, the first resistor, the j-th order second node, and a connector switches of the j-th order hierarchy switch section, a ratio between the numbers of resistors and switches present in a path routed from the x-th order middle node of the x-th order unit to the high-level reference voltage through the bypass-switching switch and the first resistor, and a ratio between the numbers of resistors and switches present in a path routed from the x-th order middle node of the x-th order unit to the low-level reference voltage through the bypass-switching switch and the first resistor.

13. A digital-analog converter circuit according to claim 12, wherein the set ratio between the numbers of resistors and switches is 1:2.

14. A digital-analog converter circuit according to claim 5, wherein the impedance corrector section comprises a third corrector section comprising:

high-level-reference-voltage connecting fourth correction switches that connects all the second nodes provided in the first order unit to the (x−2)th order unit to the high-level reference voltage;

low-level-reference-voltage connecting fourth correction switches that connect all the second nodes provided in the first order unit to the (x−2)th order unit to the high-level reference voltage; and first-node connecting fourth correction switches that connect all the second nodes provided in all units lower than or equal to a (k−2)th order unit (k=value greater or equal to 3 and less than or equal to (x−1)) to a k-th order first unit of the k-th order unit.

15. A digital-analog converter circuit according to claim 1, comprising:

a parallel highest-order unit having a configuration wherein the two second resister sections set to the second impedance value in correspondence to an x-th order bit signal are series connected, and the first to (x−1)th order units are connected to the individual second resister sections to have the hierarchical structure; and an output selector section that, when the x-th order bit signal is a first level, selects an output signal of the first order unit parallel connected to the second resister section positioned on a second voltage side and that, when the x-th order bit signal is a second level, selects an output signal of the first order unit parallel connected to the second resister section positioned on a first voltage side.

16. A digital-analog converter circuit according to claim 1, comprising:

the digital-analog converter circuit as being a first digital-analog converter circuit provided between the second reference voltage and the first reference voltage; and the digital-analog converter circuit serving as being a second digital-analog converter circuit provided between the second reference voltage and the first reference voltage and connected in the direction opposite the first digital-analog converter circuit, wherein the middle node of the x-th order unit of the first digital-analog converter circuit is connected to the middle node of the x-th order unit of the second digital analog converter circuit.

17. A digital-analog converter circuit that converts an input digital signal into an analog signal for output in accordance with a combination of a plurality of resistors connected between a high-level reference voltage and a low-level reference voltage, wherein:

the resistors have a first resistor value and a second resistor value twice the first resistor value, the digital-analog converter circuit includes a first switch section which combines the plurality of resistors, and a second switch section having a twice the impedance value of the first switch section in a conductive state which combines the plurality of resistors, and the digital-analog converter circuit is configured so that impedances between the high-level reference voltage and the low-level reference voltage are substantially the same for all analog signals being output.

* * * * *